United States Patent
Liu et al.

(10) Patent No.: US 7,362,169 B2
(45) Date of Patent: Apr. 22, 2008

(54) POWER EFFICIENT AMPLIFIER

(76) Inventors: Gang Liu, 1097 Borregas Ave., Sunnyvale, CA (US) 94089; Thomas Szepesi, 12846 Arroyo de Arguello, Saratoga, CA (US) 95070

( * ) Notice: Subject to any disclaimer, the term of this patent is extended or adjusted under 35 U.S.C. 154(b) by 66 days.

(21) Appl. No.: 11/398,078

(22) Filed: Apr. 4, 2006

(65) Prior Publication Data
US 2006/0267683 A1    Nov. 30, 2006

Related U.S. Application Data

(60) Provisional application No. 60/680,596, filed on May 12, 2005, provisional application No. 60/674,273, filed on Apr. 22, 2005, provisional application No. 60/668,433, filed on Apr. 4, 2005.

(51) Int. Cl.
*H03F 1/02* (2006.01)
(52) U.S. Cl. .......................................... 330/51; 330/69
(58) Field of Classification Search .................... 330/9, 330/51, 69, 146
See application file for complete search history.

(56) References Cited

U.S. PATENT DOCUMENTS 4,330,756 A * 5/1982 Moreau ........................ 330/51

* cited by examiner

*Primary Examiner*—Khanh Van Nguyen
(74) *Attorney, Agent, or Firm*—Schwegman, Lundberg, Woessner & Kluth, P.A.

(57) ABSTRACT

In one embodiment, an amplifier to drive a load in response to an input voltage signal, the amplifier including a first amplifier to drive the load, a second amplifier, and a control sub-circuit to put the second amplifier into an active mode to drive the load when the output voltage of the first amplifier falls outside a voltage window, and to put the second amplifier into an inactive mode when the output voltage of the first amplifier falls within the voltage window. An embodiment also includes a switch to de-couple a capacitive impedance from the load after the second amplifier is put into its active mode, and to couple the capacitive impedance to the load when the output voltage of the first amplifier falls within the voltage window. Other embodiments are described and claimed.

19 Claims, 20 Drawing Sheets

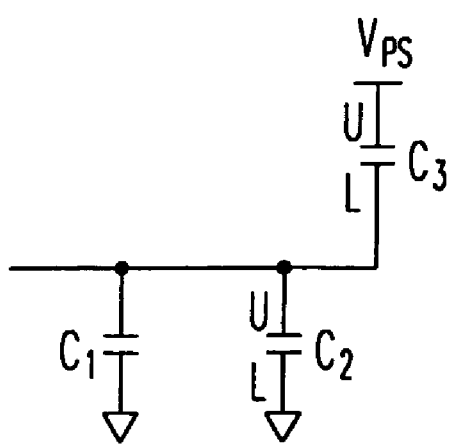 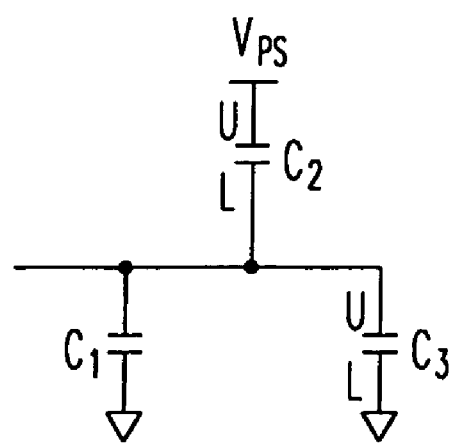
*Fig. 16a*  *Fig. 16b*

US 7,362,169 B2

POWER EFFICIENT AMPLIFIER

CLAIM OF PRIORITY

The present patent application claims the priority benefit of U.S. Application Ser. No. 60/680,596, filed May 12, 2005 entitled Electronic DC voltage Shifter Circuits, and U.S. Application Ser. No. 60/674,273, filed Apr. 22, 2005 entitled System and Method for High Efficiency Linear Amplifiers and U.S. Application Ser. No. 60/668,433 filed Apr. 4, 2005 entitled System and Method for High Efficiency Linear Amplifiers, all of which are incorporated herein by reference.

FIELD

The present invention relates to electronic amplifiers, and more particularly, to efficient electronic power amplifiers with applications to, but not limited to, audio amplification.

BACKGROUND

Linear amplifiers have been used for many years in amplification systems. They have numerous advantages over switch mode amplifiers, such as lower noise, lower distortion, lower EMI (Electro-Magnetic Interference), lower component count, and lower cost. However, linear amplifiers in general have lower power efficiency than switch mode amplifiers. The relatively low power efficiency of linear amplifiers may shorten battery run-times of battery-powered consumer electronic devices. In spite of the lower efficiency, currently linear amplifiers are more widely used in portable electronic devices than switch mode amplifiers because of the above-mentioned advantages.

A typical application of a linear amplifier is an audio amplifier for a consumer electronic device. In such applications, the audio amplifier amplifies a baseband signal, representing audio content, in order to drive a transducer, such as a speaker or headphone, to generate an acoustic signal. Various amplifier circuits have been used. FIG. 1 illustrates an audio amplifier employing two linear amplifiers to drive load 102 in response to input signal Vin(t). In this example, input signal Vin(t) is a baseband signal audio with a zero time-average. That is, its DC (Direct Current) component is zero, so that the time average of Vin(t) over long time periods is essentially zero. (The audio information is represented by the variations of Vin(t) about zero, or ground.) Load 102 may be, for example, a speaker or headphone. The circuit of FIG. 1 is sometimes referred to as an H-bridge amplifier due to its resemblance of the letter "H".

In FIG. 1, input signal Vin(t) is provided to the inverting input port (or terminal) of amplifier 110, also called the negative input port (or terminal). (In other embodiments, Vin(t) may be provided to the non-inverting input port.) Amplifier 110 may be, for example, an OPAMP (Operational Amplifier). The combination of amplifier 110 and resistors R1 and R2 comprises linear amplifier 112, where resistors R1 and R2 set the gain of linear amplifier 112. Denoting the output voltage of linear amplifier 112 as Vo1(t), the gain of linear amplifier 112 is defined as $\delta Vo1(t)/\delta Vin(t)$, the partial derivative of the voltage Vo1(t) with respect to the voltage Vin(t). This gain is often referred to as the AC (Alternating Current) gain. The gain of linear amplifier 112 is well known and is given as $-R1/R2$, where now R1 and R2 in this expression represent the resistances of resistors R1 and R2, respectively. (For ease of notation, in these letters patent a symbol used to denote a resistor in a drawing also represents its resistance value when used in an expression. That is, if a resistor is designated in a drawing by the symbol R, then its resistance value will also be indicated by the same symbol R.)

In FIG. 1, the combination of amplifier 120 and resistors R3 and R4 comprise linear amplifier 114. Resistors R3 and R4 are usually chosen to be equal in value. With this choice, the output voltage Vo2(t) of linear amplifier 114 is the negative of Vo1(t), i.e., Vo2(t)=−Vo1(t). Because of this, it is often said that the H-bridge amplifier has a differential output, and is driving its load in a differential mode. The load voltage is the voltage difference (Vo1(t)−Vo2(t)) applied to load 102, and the overall gain, Gn, for the H-bridge amplifier of FIG. 1 is $Gn = \delta(Vo1(t) - Vo2(t))/\delta Vin(t) = 2*\delta Vo1(t)/\delta Vin(t) = -2*R2/R1$. Note that in FIG. 1, Vps is the positive power supply voltage and −Vps is the negative power supply voltage.

FIG. 2a is another example of an audio amplifier, but employing only one linear amplifier 204, comprising amplifier 202 and resistors R1 and R2. (For simplicity, we will re-use symbols for resistors in various drawings. This is not meant to imply that resistors in different drawings labeled with the same symbol necessarily have the same resistance. It will be clear from context with drawing is being referred to, and therefore there should be no cause for confusion.) The gain of linear amplifier 204 is given by −R2/R1, and because only one linear amplifier is employed, this gain is also the overall gain for the circuit.

Yet another amplifier circuit is shown in FIG. 2b, again employing only one linear amplifier 210, comprising amplifier 212 and resistors R1 and R2. However, unlike the circuits of FIGS. 1 and 2a, only one power supply voltage, denoted as Vps, is needed. Accordingly, the input signal Vin(t) in FIG. 2b should have its time-average equal to Vps/2, and a bias voltage Vps/2 is applied to the non-inverting input port of amplifier 212. (Although the input signal voltage in FIG. 2b has a different time-average than that shown in FIGS. 1 and 2a, for notational convenience the same symbol, Vin(t), is used. This should be no cause for confusion.) To prevent wasted static power due to this Vps/2 average value, capacitor 215 is employed in series with load 214. Capacitor 215 is often referred to as a coupling capacitor.

The output voltage, Vo(t), of amplifier 210 is given by Vo(t)=G[Vin(t)−Vps/2]+Vps/2, where the gain G is G=−R2/R1. Capacitor 215 will have a time-average voltage difference of Vps/2, so that the load voltage applied to load 214 is Vload(t)=Vo(t)−Vps/2=G[Vin(t)−Vps/2]. (Under ideal conditions, if capacitor 215 had unlimited capacitance, the voltage drop across it would be constant, equal to Vps/2. The larger the capacitance, the less its voltage drop varies with time.)

In comparing FIGS. 2a and 2b, we see that the circuit of FIG. 2b has the advantage of requiring only one power supply voltage, but at the expense of requiring a capacitor. Capacitor 215 in series with load 214 is essentially a simple high-pass filter, and will filter out the low frequency components of the output voltage. Accordingly, in audio applications, capacitor 215 may limit audio fidelity in the bass region of the output audio signal unless it is large enough to pass the low frequencies of interest. But too large of a capacitor may not be suitable for a small, portable electronic device.

The circuits of FIGS. 2a and 2b have the same power efficiency, assuming that capacitor 215 is large enough to pass most of the desired audio signal. Note that to have the same peak output power as that of the circuit in FIG. 2a, the value for the power supply voltage Vps in FIG. 2b should be two times the value of the power supply voltage used in FIG. 2a. For the remaining discussion in this Background, we assume this relationship for the values of power supply voltage Vps used in the circuits of FIGS. 2a and 2b.

In general, a linear amplifier is linear over some range of its input voltage. As the output voltage of a linear amplifier approaches a supply rail (e.g., one of the power supply rails Vps or -Vps for the circuit of FIG. 1 or FIG. 2a, or the power supply rail Vps or ground for the circuit of FIG. 2b), the linear amplifier may saturate. For example, a simplified model for a linear amplifier requiring the two power supply voltages Vps and -Vps, such as that used in the H-bridge amplifier of FIG. 1 or used in the amplifier of FIG. 2a, is illustrated in FIG. 17a, where Vout(t) is the output voltage, Vin(t) is the input voltage, Vsat is a saturation voltage in the range 0<Vsat<Vps, and where we assume that the gain is negative. The functional relation, generalized to either a negative or positive gain G, may be written as: Vout(t)= GVin(t) for |Vin(t)|≦Vsat/|G|; Vout(t)=G*Vsat/|G| for Vin(t)> Vsat/|G|; and Vout(t)=-G*Vsat/|G| for Vin(t)≦-Vsat/|G|.

As another example of saturation, a simplified model for a linear amplifier requiring only one power supply voltage Vps, such as that used in the circuit of FIG. 2b, is illustrated in FIG. 17b, where the saturation voltage is in the range 0<Vsat<Vps/2, and where again we assume that G is negative. The functional relation, generalized to either a negative or positive gain G, is: Vout(t)=G[Vin(t)-Vps/2]+Vps/2 for |Vin(t)-Vps/2|≦Vsat/|G|; Vout(t)=G*Vsat/|G|+Vps/2 for Vin (t)-Vps/2>Vsat/|G|; and Vout(t)=-G*Vsat/|G| for Vin(t)- Vps (Vsat depends upon the power supply voltage, so that if the power supply voltage for the circuit of FIG. 2b is twice that of FIG. 2a in order for the two circuits to provide the same peak output power, then ideally the saturation voltage for each circuit will have the same value.)

With the above simple model in mind, for a single-amplifier circuit, such as the circuit of FIG. 2a or FIG. 2b, the magnitude of the voltage drop across the load, the load voltage, does not exceed Vsat. (Remember, we are assuming that the value of the supply voltage used for FIG. 2b is twice that used in FIG. 2a, so that the numerical values for their saturation voltages are the same, which we denote simply as Vsat.) However, for the H-bridge amplifier of FIG. 1, the magnitude of the load voltage can go up 2Vsat. As a result, the H-bridge amplifier is capable of delivering a peak power to its load four times that of the single-amplifier circuit of FIG. 2a or FIG. 2b. However, two amplifiers need to be powered in the H-bridge amplifier, resulting in twice the power dissipation as for a single-amplifier circuit. (Here, "power dissipation" is the power consumed by an amplifier; it is not the power delivered to the load.)

It would be advantageous for a linear power amplifier to drive a load at a higher peak power than that of a linear single-amplifier power amplifier, and yet have the power efficiency of a linear single-amplifier power amplifier.

BRIEF DESCRIPTION OF THE DRAWINGS

FIG. 11b illustrates the definition of the current and voltage as used in FIG. 11a.

FIG. 15(b) illustrates the switching waveform for the switched-capacitor circuit in FIG. 15a.

FIGS. 16a and 16b illustrate the two states of the switched-capacitor circuit in FIG. 15a.

DESCRIPTION OF EMBODIMENTS

Figure 3A:
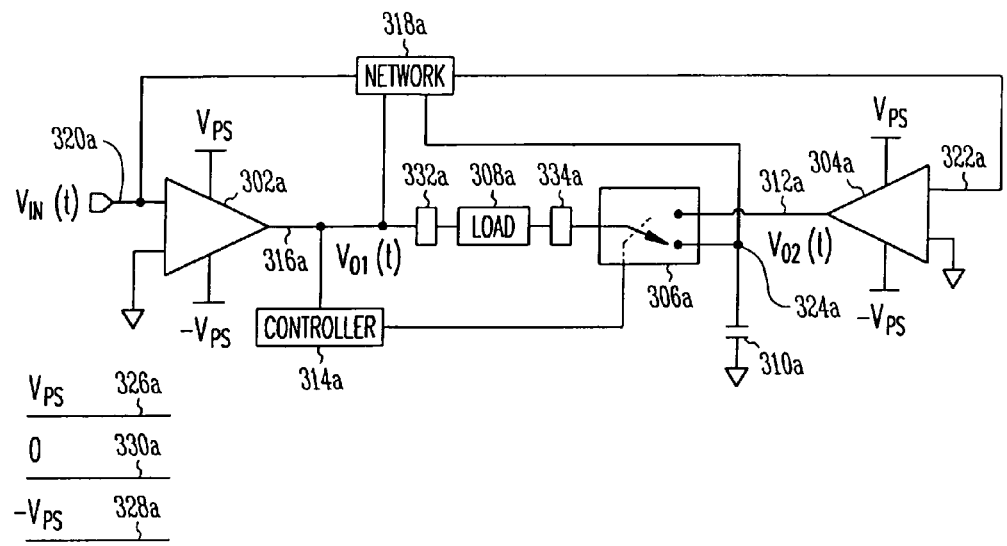
FIGS. 3a and 3b illustrate embodiments of the present invention at a system level.

FIG. 3a is a high level abstraction of some embodiments of the present invention. Amplifiers 302a and 304a are linear amplifiers. Switch 306a has two states. When in a first state, load 308a is connected to capacitor 310a but not to amplifier 304a; and when in a second state, load 308a is connected to amplifier 304a but not to capacitor 310a. Controller 314a sets the state of switch 306a, and is connected to output port 316a of amplifier 302a. Network (or sub-circuit) 318a couples input port 320a of amplifier 302a, output port 316a of amplifier 302a, and the capacitor 310a to input port 322a of amplifier 304a. In practice, network 318a may be realized as a resistor network.

Two power rails, 326a and 328a, are at power supply voltages Vps and !Vps, respectively. These voltages are with respect to ground potential, provided by ground rail 330a, which may be taken as zero volts. Power supply voltages Vps and !Vps are provided to linear amplifiers 302a and 304a. Also, ground potential is provided as well to these amplifiers, and is shown as being applied to one of their input ports. (All voltages are with respect to ground voltage, which is taken as zero.) Input voltage Vin(t) is provided at input port 320a. We do not indicate whether it is applied to an inverting input port or a non-inverting input port, because in some embodiments, Vin(t) may be applied to the inverting input port, and for others, Vin(t) may be applied to the non-inverting input port. The output voltage of linear amplifier 302a or amplifier 304a is assumed, for simplicity of discussion, to be zero if the voltage difference between their input ports Vin(t) is zero, but this is not a requirement. Vin(t) is assumed to have a zero time-average, so that its DC component is zero. The time-average voltage drop across capacitor 310a is zero. Accordingly, capacitor 310a may not be needed, so that for some embodiments, node 324a is grounded.

Figure 3B:
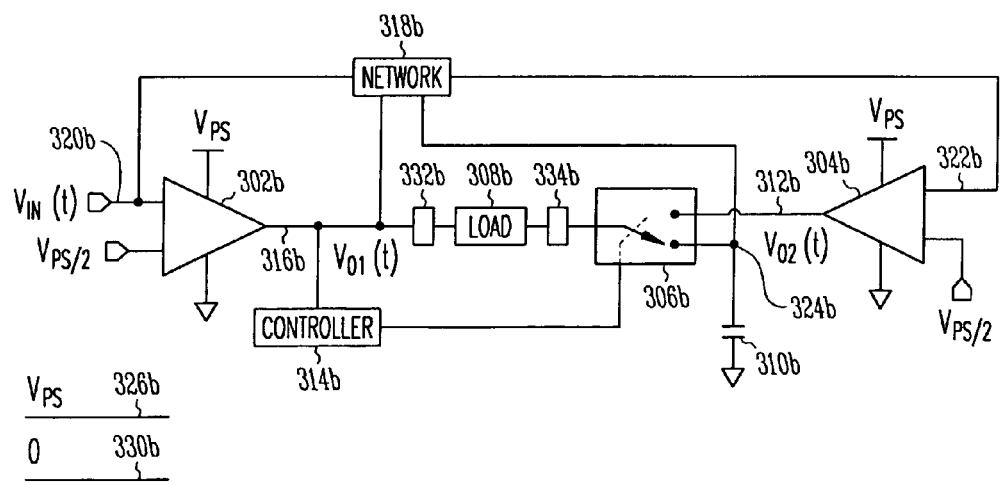

FIG. 3b is another high level abstraction of some embodiments of the present invention. As in FIG. 3a, amplifiers 302b and 304b are linear amplifiers. Switch 306b has two states. When in a first state, load 308b is connected to capacitor 310b but not to amplifier 304b; and when in a second state, load 308b is connected to amplifier 304b but not to capacitor 310b. Controller 314b sets the state of switch 306b, and is connected to output port 316b of amplifier 302b. Network (or sub-circuit) 318b couples input port 320b of amplifier 302b, output port 316b of amplifier 302b, and the capacitor 310b to input port 322b of amplifier 304b. In practice, network 318b may be realized as a resistor network.

Note that for FIG. 3b, supply voltage Vps is provided by power rail 326a and ground potential is provided by ground rail 330a, which again may be taken as zero volts, but supply voltage !Vps is not provided for the embodiments represented by FIG. 3. Accordingly, input voltage Vin(t) has a time-average equal to Vps/2. For simplicity of discussion, it is also assumed that the amplifiers in FIG. 3 have an output voltage Vps/2 in response to a zero differential input voltage, but this is not a requirement.

As discussed with respect to the prior art amplifiers, capacitor 310b has a time-average voltage drop of Vps/2. If node 324b were to be grounded, the time-average of the voltage drop across load 308b would ideally be Vps/2, which would cause wasted static power dissipation in load 308b. By employing capacitor 310b, the time-average voltage drop across load 308b is ideally zero.

Circuits employing the embodiments represented by FIGS. 3a and 3b may comprise discrete components, or one or more integrated circuits. Furthermore, not all embodiments need comprise all of the elements or functional blocks indicated in FIGS. 3a and 3b. For example, in FIG. 3a, elements 332a and 334a indicate output ports (e.g., connectors, terminals, solder pads, etc.) to which load 308a may be connected. Load 308a may be a transducer for generating acoustic energy in response to an electrical input signal, such as a speaker or a headphone. Load 308a may be the input port of another amplifier system. Similar statements regarding elements 332b, 334b, and 308b in FIG. 3b also apply.

As an example, a circuit may be built and sold without a load, where the intended load is a headphone that is to be connected to a headphone jack, or perhaps a speaker that is to be connected to some type of connector or where its terminals are to be soldered to pads. Other embodiments may not have discrete connectors to which a load is connected, but may include an integrated load.

In the claims, we will refer to ports, connectors, pads, etc., for coupling a load, e.g., elements 332a, 334a, 332b, and 334b, as load ports. In describing the embodiments in more detail below, these load ports are not explicitly drawn in the accompanying drawings, but they may be included in these embodiments as described with respect to FIGS. 3a and 3b.

It should also be appreciated that reference to a "port", whether a load port, input port, or output port, may physically comprise an interconnect, or a portion thereof, and may be used interchangeable with the term "node" or "terminal".

Before describing in more detail various embodiments of the present invention, it is useful to consider the high level abstractions represented by FIGS. 3a and 3b, and to describe in an approximate way their operation. First, consider FIG. 3a. When amplifier 302a is operating linearly, its output voltage Vo1(t) is Vo1(t)=G*Vin(t), where G is its gain. During linear operation, switch 306a is set to its first state so that load 308a is connected to capacitor 310a but not to amplifier 304a. If capacitor 310a were ideal, its voltage drop would be zero so that node 324a is held at ground. (For those embodiments without a coupling capacitor, node 324a is grounded.) Consequently, during linear operation, the load voltage, Vload, provided to load 308a is Vload=G*Vin(t). Network 318a is such that during linear operation, the output voltage Vo2(t) of amplifier 304a is zero, the same as node 324a.

When amplifier 302a goes into saturation, its output voltage is either Vsat or −Vsat, where 0<ξVsatξ<ξVpsξ. Assume for this discussion that it is at Vsat. (For saturation at −Vsat, discussion of the circuit operation is the same as that for the Vsat case, and need not be repeated.) During saturation, controller 314a sets switch 306a to its second state so as to connect load 308a to the output of amplifier 304a. Network 318a is such that during saturation, the output voltage Vo2(t) of amplifier 304a is −G*Vin(t)+Vsat. Consequently, the load voltage Vload provided to load 308a, the difference in output voltages between amplifiers 302a and 304a, is Vload=Vsat+G*Vin(t)−Vsat=G*Vin(t), which is the desired result. That is, amplifiers 302a and amplifier 304a together provide an undistorted amplified version of Vin(t) even if amplifier 302a is saturating.

When amplifier 302a is operating linearly, only amplifier 302a is working to drive load 308a, but when amplifier 302a is saturating, amplifier 304a is switched in to drive load 308a. Consequently, it is expected that embodiments represented by FIG. 3a are more power efficient than two-amplifier systems such as that of FIG. 1, and yet achieve a higher fidelity than single-amplifier systems such as that of FIG. 2a or 2b.

Consider now FIG. 3b. When amplifier 302b is operating linearly, its output voltage Vo1(t) is Vo1(t)=G*(Vin(t)−Vps/2)+Vps/2, where G is its gain. During linear operation, switch 306b is set to its first state so that load 308b is connected to capacitor 310b but not to amplifier 304b. If capacitor 310b were ideal, its voltage drop would be Vps/2, so that node 324b is at Vps/2. Consequently, during linear operation, the load voltage Vload provided to load 308b is Vload=G*(Vin(t)−Vps/2). Network 318b is such that during linear operation, the output voltage Vo2(t) of amplifier 304b is Vps/2, the same as node 324b.

When amplifier 302b goes into saturation, its output voltage is either Vsat+Vps/2 or −Vsat+Vps/2, where −Vps/2<Vsat<Vps/2. Assume that saturation is at Vsat+Vps/2. (Discussion for the other saturation case is the same and need not be repeated.) During saturation, controller 314b sets switch 306b to its second state so as to connect load 308b to the output of amplifier 304b. Network 318b is such that during saturation, the output voltage Vo2(t) of amplifier 304b is Vo2(t)=−G*(Vin(t)−Vps/2)+Vsat+Vps/2. Consequently, the load voltage Vload provided to load 308b, the difference in output voltages between amplifiers 302b and 304b, is Vload=Vsat+Vps/2+G*(Vin(t)−Vps/2)−Vsat−Vps/2), which is the desired result. That is, amplifiers 302b and amplifier 304b together provide an undistorted amplified version of Vin(t) even if amplifier 302b is saturating.

When amplifier 302b is operating linearly, only amplifier 302b is working to drive load 308b, but when amplifier 302b is saturating, amplifier 304b is switched in to drive load 308b. Consequently, just as for FIG. 3a, it is expected that embodiments represented by FIG. 3b are more power efficient than two-amplifier systems such as that of FIG. 1, and yet achieve a higher fidelity than single-amplifier systems such as that of FIG. 2a or 2b.

It should be noted that the above description for the operation of circuits represented by FIG. 3a and FIG. 3b is only approximate, and is not meant to precisely describe the operation of actual embodiments of the invention. This is because for a linear amplifier, the demarcation between linear and non-linear (saturating) operation may not be precisely defined or precisely known.

Figure 17B:
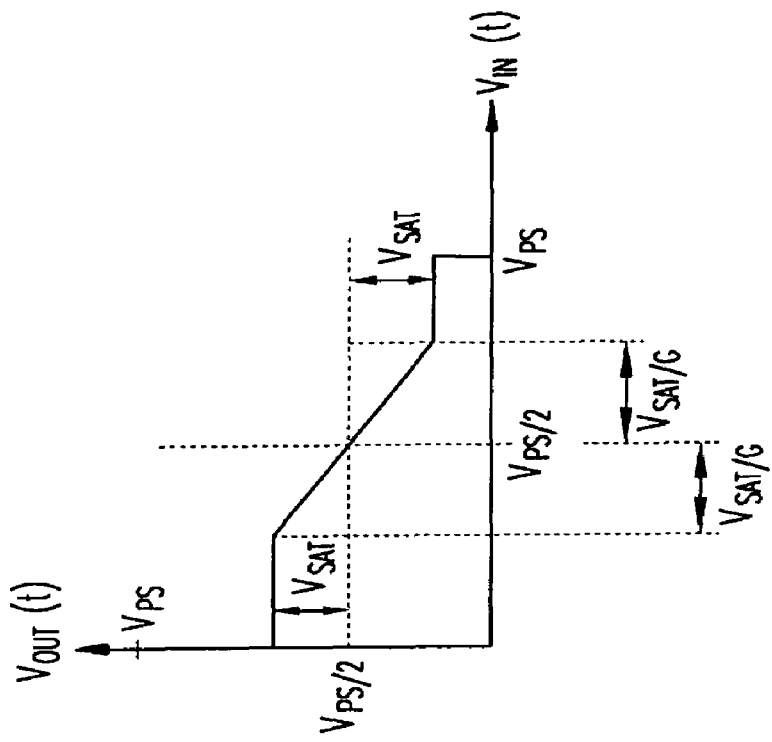
FIGS. 17a and 17b illustrate a simplified saturation model for linear amplifiers employing two power supply voltages and one power supply voltage, respectively.
Figure 17A:
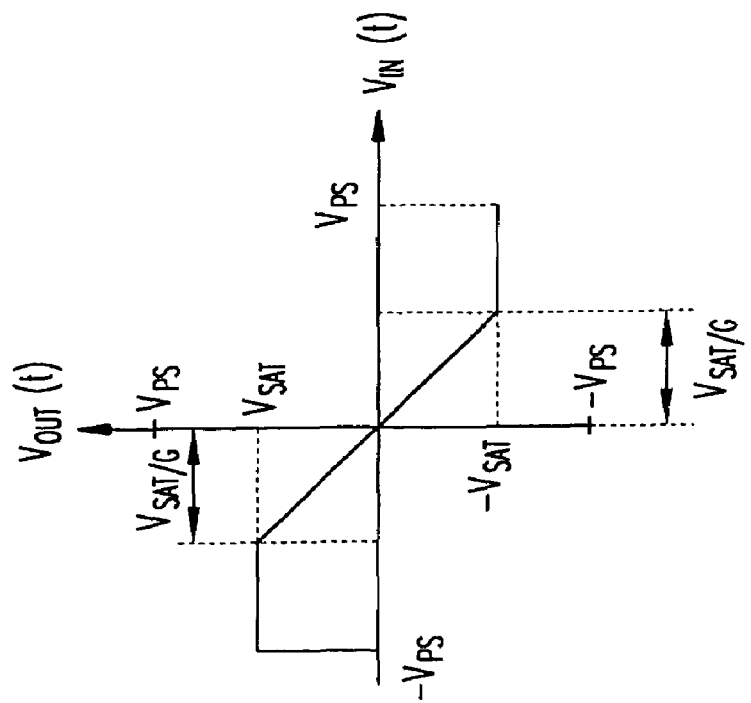

For example, as discussed in the Background section, a simplified functional relationship between output voltage and input voltage for a linear amplifier may be illustrated as shown in FIGS. 17a and 17b. For FIG. 17a, linear operation may be specified as those input voltages Vin(t) within the interval [−Vsat/G, Vsat/G], or equivalently, as those output voltages Vout(t) within the interval [−Vsat, Vsat]. For FIG. 17b, linear operation may be specified as those input voltages Vin(t) within the interval [−Vsat/G+Vps/2, Vsat/G+Vps/2], or equivalently, as those output voltages Vout(t) within the interval [−Vsat+Vps/2, Vsat+Vps/2].

In more realistic models, however, there will be a range of input and output voltages for which there is a substantially linear relationship between output voltage and input voltage, a range of input and output voltages for which there is a non-zero AC gain but for where the relationship between the output voltage and the input voltage is not substantially linear, and a range of input voltage for which the output voltage saturates so that the AC gain is substantially zero. For ease of description, an amplifier may be referred to as being in pre-saturation when its range of input and output voltage is such that there is a non-zero AC gain but for where the relationship between the output voltage and the input voltage is not substantially linear.

In practice, for embodiments represented by FIG. 3a, controller 314a may be coupled to amplifier 302a such that amplifier 304a is switched in to drive load 308a while amplifier 302a is still operating linearly, but before it enters pre-saturation. A similar statement may apply to the respective components in FIG. 3b.

Furthermore, amplifier 304a (or 304b) does not precisely replicate the negative of that portion of the output voltage signal that amplifier 302a (or 302b) would have provided if amplifier 302a (or 302b) wasn't saturating. It should be understood that the above approximate description for the operation of circuits represented by FIG. 3a and FIG. 3b was given merely to motivate and to provide an intuitive understanding regarding the embodiments. With this in mind, we now describe in more detail the embodiments.

Figure 4:
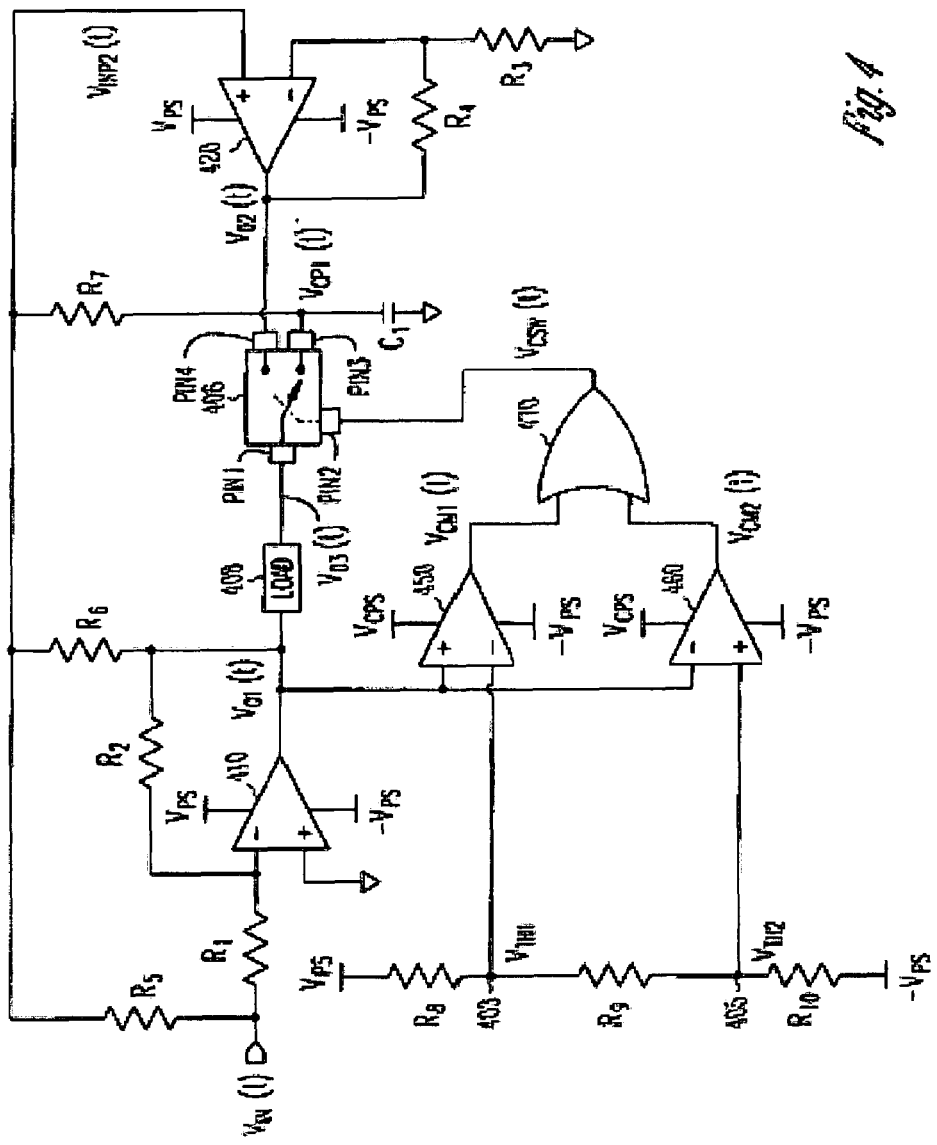
FIG. 4 illustrates an embodiment of the present invention at a more detailed level.

Referring now to FIG. 4, supply voltages Vps and −Vps are provided, and input voltage Vin(t) has a time-average equal to ground, taken as 0 volts. Output voltage Vo1(t) of linear amplifier 410 is provided to comparators 450 and 460. Comparators 450 and 460 are powered by a power supply voltage Vcps, which may or may not be equal to Vps, the positive power supply for linear amplifiers 410 and 420. Threshold voltages Vth1 and Vth2 at nodes 403 and 405, respectively, are set by resistors R8, R9, and R10 such that Vth1 is almost equal to Vps and Vth2 is almost equal to −Vps. For example, we may set Vth1=0.95*Vps and Vth2=−0.95*Vps. For some embodiments, the condition Vth2<Vo1(t)<Vth1 is indicative of the condition that amplifier 410 is operating linearly. That is, these threshold voltages may be set so that Vth2<Vo1(t)<Vth1 is indicative of amplifier 410 operating linearly but not yet in pre-saturation.

Referring now to electronic switch 406, pin 1 is the common terminal, and pin 2 is the digital control input terminal. When digital control input pin 2 is at logic LOW, pin 3 is connected to the common terminal, pin 1, via switch 406. When digital control input pin 2 is at logic HIGH, pin 4 is connected to the common terminal, pin 1, via switch 406. Logic OR gate 470 outputs to pin 2 a logic HIGH signal upon detecting any of its input voltages, Vcm1(t) or Vcm2(t), at logic HIGH; and outputs to pin 2 a logic LOW signal otherwise. In practice, logic OR gate 470 is powered at an appropriate power supply voltage, such as Vcps, Vps, or at another voltage.

Resistors R1 and R2 set the voltage gain for amplifier 410, denoted by G1, as:

$$G1 = \frac{\partial Vo1(t)}{\partial Vin(t)} = -\frac{R2}{R1}. \quad (1)$$

The gain G1 has a negative value because the input signal Vin(t) is fed to the inverting input port of amplifier 410. Note that for amplifier 410 operating rail-to-rail, not only are the differential voltages related by Vo1(t)=G1*Vo1(t), but also we have Vo1(t)=G1*Vin(t).

Resistors R3 and R4 set the voltage gain for the amplifier 420, denoted by G2, as:

$$G2 = \frac{\partial Vo2(t)}{\partial Vinp2(t)} = 1 + \frac{R4}{R3}. \quad (2)$$

Again, we also have Vo2(t)=G1*Vin(t).

We now define several more gains. These definitions will be useful when considering conditions, to be discussed later, under which amplifier 420 provides the appropriate voltage signal to "restore" the clipped output voltage of amplifier 410 when saturating. To this end, define the gains $$G3 = \frac{\partial Vinp2(t)}{\partial Vin(t)}, \quad (3)$$

$$G4 = \frac{\partial Vinp2(t)}{\partial Vo1(t)}, \quad (4)$$

and $$G5 = \frac{\partial Vinp2(t)}{\partial Vcp1(t)}. \quad (5)$$

These gains are given by:

$$G3 = \frac{\partial Vinp2(t)}{\partial Vin(t)} = \frac{1}{\left[R5 + \frac{1}{\frac{1}{R6} + \frac{1}{R7}}\right]\left(\frac{1}{R6} + \frac{1}{R7}\right)} = \frac{1}{R5*\left(\frac{1}{R6} + \frac{1}{R7}\right) + 1}, \quad (6)$$

-continued $$G4 = \frac{\partial Vinp2(t)}{\partial Vo1(t)} = \qquad (7)$$

$$\frac{1}{\left[R6 + \frac{1}{\frac{1}{R5} + \frac{1}{R7}}\right]\left(\frac{1}{R5} + \frac{1}{R7}\right)} = \frac{1}{R6*\left(\frac{1}{R5} + \frac{1}{R7}\right)+1}, \text{ and}$$

$$G5 = \qquad (8)$$

$$\frac{\partial Vinp2(t)}{\partial Vcp1(t)} = \frac{1}{\left[R7 + \frac{1}{\frac{1}{R5} + \frac{1}{R6}}\right]\left(\frac{1}{R5} + \frac{1}{R6}\right)} = \frac{1}{R7*\left(\frac{1}{R5} + \frac{1}{R6}\right)+1}.$$

Resistors R1, R2, R3, R4, R5, R6, and R7 may be chosen to satisfy the following three conditions:

Condition (1): When amplifier 410 is operating linearly, the variation in the voltage Vinp2(t) (the input voltage to amplifier 420) due to a variation in Vin(t) cancels the variation in the voltage Vinp2(t) due to a variation in Vo1(t). By variation, we mean a small variation or differential, and will use the symbol ±δ6. That is, for some arbitrary variable V, δV denotes a small variation or differential in the variable V. Note that when amplifier 410 is operating linearly, we have δVo1(t)=[G1]δVin(t). With this notation, condition (1) may be restated as: δVinp2(t)=[δVinp2(t)/δVin(t)]δVin(t)+[δVinp2(t)/δVo1(t)]δVo1(t)=0, where because amplifier 410 is assumed to be operating linearly, the differentials in Vin(t) and Vo1(t) are related by δVo1(t)=[G1]δVin(t).

Condition (2): The voltage gain, G6, defined as G6=δVo2(t)/δVcp1(t), is set to 1. That is, $$G6 = \frac{\partial Vo2(t)}{\partial Vcp1(t)} = 1. \qquad (9)$$

Writing G6 as $$G6 = \frac{\partial Vo2(t)}{\partial Vcp1(t)} = \frac{\partial Vo2(t)}{\partial Vinp2(t)} * \frac{\partial Vinp2(t)}{\partial Vcp1(t)},$$

we obtain $$G6 = \frac{\partial Vo2(t)}{\partial Vcp1(t)} = \frac{\partial Vo2(t)}{\partial Vinp2(t)} * \frac{\partial Vinp2(t)}{\partial Vcp1(t)} = G2*G5 \qquad (10)$$

$$= \left(1 + \frac{R4}{R3}\right) * \frac{1}{R7*\left(\frac{1}{R5} + \frac{1}{R6}\right)+1} = 1.$$

Condition (3): The voltage gain G7 defined as $$G7 = \frac{\partial Vo2(t)}{\partial Vin(t)}, \qquad (11)$$

is set equal to −G1. That is, $$G7 = -G1. \qquad (12)$$

Writing $$G7 = \frac{\partial Vo2(t)}{\partial Vin(t)} = \frac{\partial Vo2(t)}{\partial Vinp2(t)} * \frac{\partial Vinp2(t)}{\partial Vin(t)} = G2*G3, \qquad (13)$$

one obtains the condition $$\left(1 + \frac{R4}{R3}\right) * \frac{1}{R5*\left(\frac{1}{R6} + \frac{1}{R7}\right)+1} = \frac{R2}{R1}. \qquad (14)$$

To understand the significance of these conditions, for simplicity we assume for the moment that capacitor C1 is ideal so that δVcp1(t)=0 and amplifier 410 is perfectly linear until some time instant T1, after which it saturates by outputting a constant voltage Vsat. Under these simplifying assumptions, condition 1 ensures that when amplifier 410 is operating linearly, the differential (or small variation) in the output voltage of amplifier 420 is zero. That is, amplifier 410 provides a constant output voltage independent of Vin(t). This constant is easily seen to be zero because at Vin(t)=0, the output voltage of amplifier 410 is Vo1(t)=0, so that Vo2(t)=0. Thus, when switch 406 connects the output port of amplifier 420 to load 408 at time instant T1, the output voltage provided to load 408 by amplifier 420 is initially zero.

After time T1 with amplifier 410 now operating in saturation, we have Vo1(t)=Vsat. But condition 3 ensures that the differential in the output voltage provided by amplifier 420 to load 408 is −G1*δVin(t). Because condition 1 ensured that the output voltage of amplifier 420 was initially zero at time instant T1, conditions 1 and 3 together ensure that the output voltage of amplifier 420 after time instant T1 is Vo2(t)=−G1*Vin(t)+Vsat. Consequently, the load voltage Vload(t), defined as the difference between the output voltages of amplifiers 410 and 420, is given by Vload(t)=Vo1(t)−Vo2(t)=Vsat+G1*Vin(t)−Vsat=G1*Vin(t), which is the desired result. Loosely stated, during saturation, amplifier 420 restores that part of the load voltage that amplifier 410 would have provided if it wasn't saturating.

Furthermore, note that amplifier 420 is not saturating because it need only provide the output voltage −G1*Vin(t)+Vsat, i.e., the "clipped" portion, which in practice will not be close to Vps or −Vps.

Of course, the above simplifying assumptions regarding the ideal nature of amplifier 420 in which it goes abruptly into saturation at some time instant TI, and where it is perfectly linear before time T1 and outputs a constant saturation voltage after T1, are only met approximately in practice. Hence, the description of the embodiments regarding how amplifier 420 restores the clipped portion of the output of amplifier 410 is meant to provide understanding of the embodiments, and is not meant to provide an exact description of embodiments or their operation.

Finally, the significance of condition 2 is that when amplifier 410 is not saturated, the output voltage Vo2(t) of amplifier 420 follows (approximately) the voltage on capacitor C1, and consequently, when switch 406 changes its state so that pin 1 connects to pin 4 instead of pin 3, the voltage provided to load 408 does not abruptly change, so that there will not be a "glitch" generated by the switching action.

To satisfy the above three conditions, the following procedure may be followed. First, determine the gain for amplifier 410 according to the system needs so that R1 and R2 may be determined. It is important to notice that, in theory, these two resistors may have almost any value, as long as their ratio determines the desired gain. In practice, these resistor values may range from hundreds of Ohms to hundreds of Kilo Ohms, depending on the type of circuit used to realize the amplifier. One design rule to consider when choosing the resistance values is that, in general, the lower the resistance, the lower the noise, and the lower the error voltages caused by the input bias currents of the amplifier. However, the lower the resistance, the higher the power loss consumed by the resistors. Therefore, it is often found in practice that these resistor values are in the tens of kilo Ohms.

Secondly, to meet the requirement listed in Condition 1 above, note that the variation in the voltage Vinp2(t), δVinp2(t), due to a variation in the voltage Vin(t), δVin(t), is:

$$\delta Vinp2(t) = \delta Vin(t) * G3 = \frac{\delta Vin(t)}{R5*\left(\frac{1}{R6}+\frac{1}{R7}\right)+1}, \tag{15}$$

and the variation in the voltage Vinp2(t), δVinp2(t), due to a variation in the voltage Vo1(t), δVo1(t), is:

$$\delta Vinp2(t) = \delta Vo1(t) * G4 = \frac{\delta Vo1(t)}{R6*\left(\frac{1}{R5}+\frac{1}{R7}\right)+1}. \tag{16}$$

From eq. (1), when amplifier 410 is operating linearly, we have $$\delta Vo1(t) = G1 * \delta Vin(t) = -\frac{R2}{R1}\delta Vin(t),$$

and combining with eq. (16), one obtains $$\delta Vo1(t) * G4 = \frac{-\frac{R2}{R1}\delta Vin(t)}{R6*\left(\frac{1}{R5}+\frac{1}{R7}\right)+1}. \tag{17}$$

Making the absolute values of eq. (15) and eq. (17) the same, but having opposite polarity, one obtains $$\frac{\delta Vin(t)}{R5*\left(\frac{1}{R6}+\frac{1}{R7}\right)+1} = \frac{\frac{R2}{R1}\delta Vin(t)}{R6*\left(\frac{1}{R5}+\frac{1}{R7}\right)+1}, \tag{18}$$

$$\frac{1}{R5*\left(\frac{1}{R6}+\frac{1}{R7}\right)+1} = \frac{\frac{R2}{R1}}{R6*\left(\frac{1}{R5}+\frac{1}{R7}\right)+1},$$

$$\frac{R5}{R6}+\frac{R5}{R7}+1 = \frac{R6*\left(\frac{1}{R5}+\frac{1}{R7}\right)+1}{\frac{R2}{R1}}, \text{ and}$$

$$\frac{R5}{R6}+\frac{R5}{R7}+1 = \frac{\frac{R6}{R5}+\frac{R5*R6}{R7*R5}+1}{\frac{R2}{R1}} = \frac{R6}{R5}*\left(\frac{1+\frac{R5}{R7}+\frac{R5}{R6}}{\frac{R2}{R1}}\right),$$

yielding $$\frac{R6}{R5}=\frac{R2}{R1}.$$

Thirdly, meet the requirement listed in Condition 2 above by using eq. (10):

$$G6 = \left(1+\frac{R4}{R3}\right)*\frac{1}{R7*\left(\frac{1}{R5}+\frac{1}{R6}\right)+1} = 1, \tag{19}$$

to obtain, $$1+\frac{R4}{R3} = R7*\left(\frac{1}{R5}+\frac{1}{R6}\right)+1.$$

Finally, derive an equation to meet the requirement listed in Condition 3 above. From eq. (13), $$\left(1+\frac{R4}{R3}\right)*\frac{1}{R5*\left(\frac{1}{R6}+\frac{1}{R7}\right)+1} = \frac{R2}{R1}, \text{ and} \tag{20}$$

$$1+\frac{R4}{R3} = \frac{R2}{R1}*\left[R5*\left(\frac{1}{R6}+\frac{1}{R7}\right)+1\right].$$

Combine eq. (19) with eq. (20) to yield, $$R7*\left(\frac{1}{R5}+\frac{1}{R6}\right)+1 = \frac{R2}{R1}*\left[R5*\left(\frac{1}{R6}+\frac{1}{R7}\right)+1\right],$$

$$\frac{R7}{R5}+\frac{R7}{R6}+1 = \frac{R2}{R1}*\left(\frac{R5}{R6}+\frac{R5}{R7}+1\right) = \frac{R2}{R1}*\frac{R5}{R7}*\left(\frac{R7}{R6}+1+\frac{R7}{R5}\right),$$

$$1 = \frac{R2}{R1}*\frac{R5}{R7}, \text{ yielding}$$

$$R7 = \frac{R2}{R1}*R5.$$

Combining with (18) yields $$R7 = \frac{R6}{R5}*R5 = R6. \tag{21}$$

From eq. (19):

$$1+\frac{R4}{R3} = R7*\left(\frac{1}{R5}+\frac{1}{R6}\right)+1, \tag{22}$$

we obtain $$\frac{R4}{R3} = R7*\left(\frac{1}{R5}+\frac{1}{R6}\right) = \frac{R6}{R5}+1.$$

We summarize the above procedure for satisfying the above three conditions: Determine R1 and R2 by eq. (1) according to the system needs, where $$G1 = \frac{\partial Vo1(t)}{\partial Vin(t)} = -\frac{R2}{R1}.$$

Determine the ratio of R6 and R5 by eq. (18):

$$\frac{R6}{R5} = \frac{R2}{R1}.$$

(Note that one of the two resistors, R5 or R6, may be set, in theory, to any value, as long as the ratio determines the desired gain. In practice, the resistor values are often chosen to be in the range of hundreds of Ohms to hundreds of Kilo Ohms.) Determine R7 by eq. (21):

$$R7=R6.$$

Determine the ratio of R4 and R3 by eq. (22):

$$\frac{R4}{R3} = \frac{R6}{R5} + 1.$$

We illustrate the above by a numerical example. Various waveforms will also be provided for this numerical example. (All resistances are in Ohms.) Set G1=−2 by setting $$R2 = 20K, \text{ and}$$

$$R1 = -\frac{R2}{G2} = 10K.$$

Set R5=10K, so that $$R6 = \frac{R2}{R1}R5 = 2*10K = 20K.$$

Calculate R7 by $$R7=R6=20K.$$

Next, calculate R4 and R3 by $$\frac{R4}{R3} = \frac{R6}{R5} + 1 = \frac{20K}{10K} + 1 = 3,$$

Finally, set R3=10K, so that $$R4=3*10K=30K.$$

Figure 5:
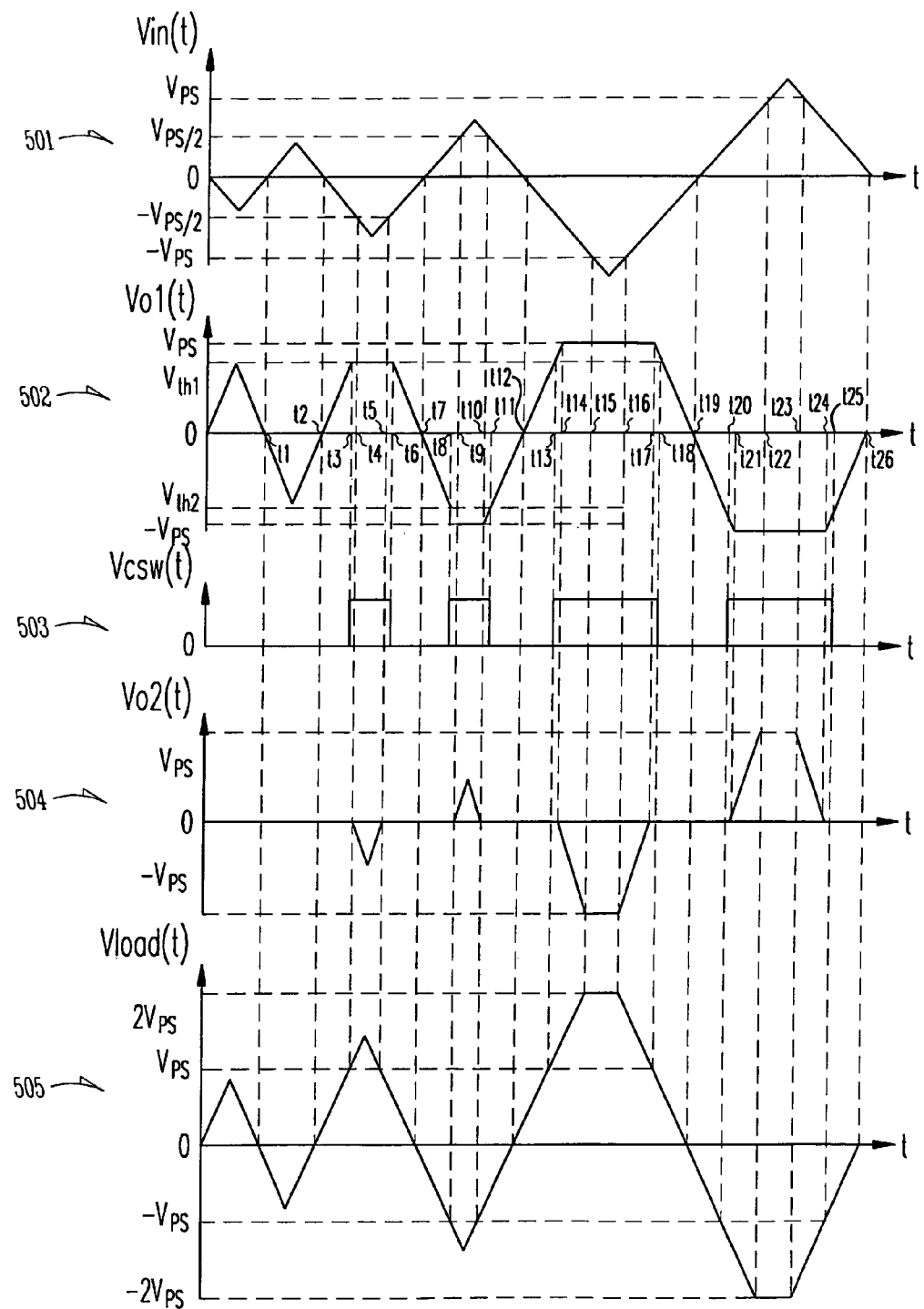
FIG. 5 illustrates simulated voltage waveforms for the embodiment of FIG. 4.

FIG. 5 provides various simulated waveforms for the above resistor values. (The waveforms were generated based on the assumption that amplifiers 410 and 420 have rail-to-rail output capability. In practice, this capability is not necessary.) Resistors R8, R9, and R10 were chosen so that Vth1=0.95*Vps and Vth2=−0.95*Vps. The horizontal axis for the plots is time, and the vertical axis for the plots is voltage. Various instances of time are labeled and will be referred when describing the waveforms.

The waveform for input voltage Vin(t) is as shown in plot 501 of FIG. 5. Roughly speaking, it changes from a small triangle waveform to a medium triangle waveform, and then to a larger triangle waveform to illustrate the behavior of the amplifier at different input levels. Plot 502 shows the output signal waveform, Vo1(t), for amplifier 410. It can be seen that during the time periods of 0 to t4, t5 to t9, t10 to t14, t17 to t21, and t24 to t26, amplifier 410 exhibits a gain of −2 without saturation. During the time periods of t3 to t6 and t13 to t18, output voltage Vo1(t) exceeds the threshold voltage of comparator 450, Vth1, so that comparator 450 provides a HIGH logic signal to OR gate 470. Thus, the output voltage of logic gate 470, Vcsw(t) (see FIG. 4), comprises pulses as shown in plot 503 during time periods t3 to t6 and t13 to t18. In similar fashion, during the time periods t8 to t11 and t20 to t25, output voltage Vo1(t) goes below the threshold voltage of comparator 460, Vth2, and comparator 460 provides a logic HIGH signal to OR gate 470. Consequently, voltage signal Vcsw(t) comprises pulses as shown in plot 503 during in the time periods t8 to t11 and t20 to t25.

Amplifier 420 output voltage, Vo2(t), is shown in plot 504. It can be seen that during the time periods of t4 to t5, t9 to t10, t14 to t17, and t21 to t24, the waveform for Vo2(t) exhibits clipping because amplifier 410 is saturating. (During the time periods of 0 to t4, t5 to t9, t10 to t14, t17 to t21, and t24 to t26, amplifier 420 is not working because of condition 1 as described above is satisfied.) As output voltage Vcsw(t) of logic gate 470 goes HIGH, switch 406 is switched to connect the output port of amplifier 420 to load 408. For simplicity of generating the waveforms, we assume switch 406 is ideal, so that there is no significant voltage drop between its input and output, that is, Vo3(t)=Vo2(t) (see FIG. 4). The potential difference provided across load 408, denoted as Vload(t) in plot 505, is Vload(t)=Vo1(t)−Vo3(t)= Vo1(t)−Vo2(t), and is shown in plot 505.

Figure 1:
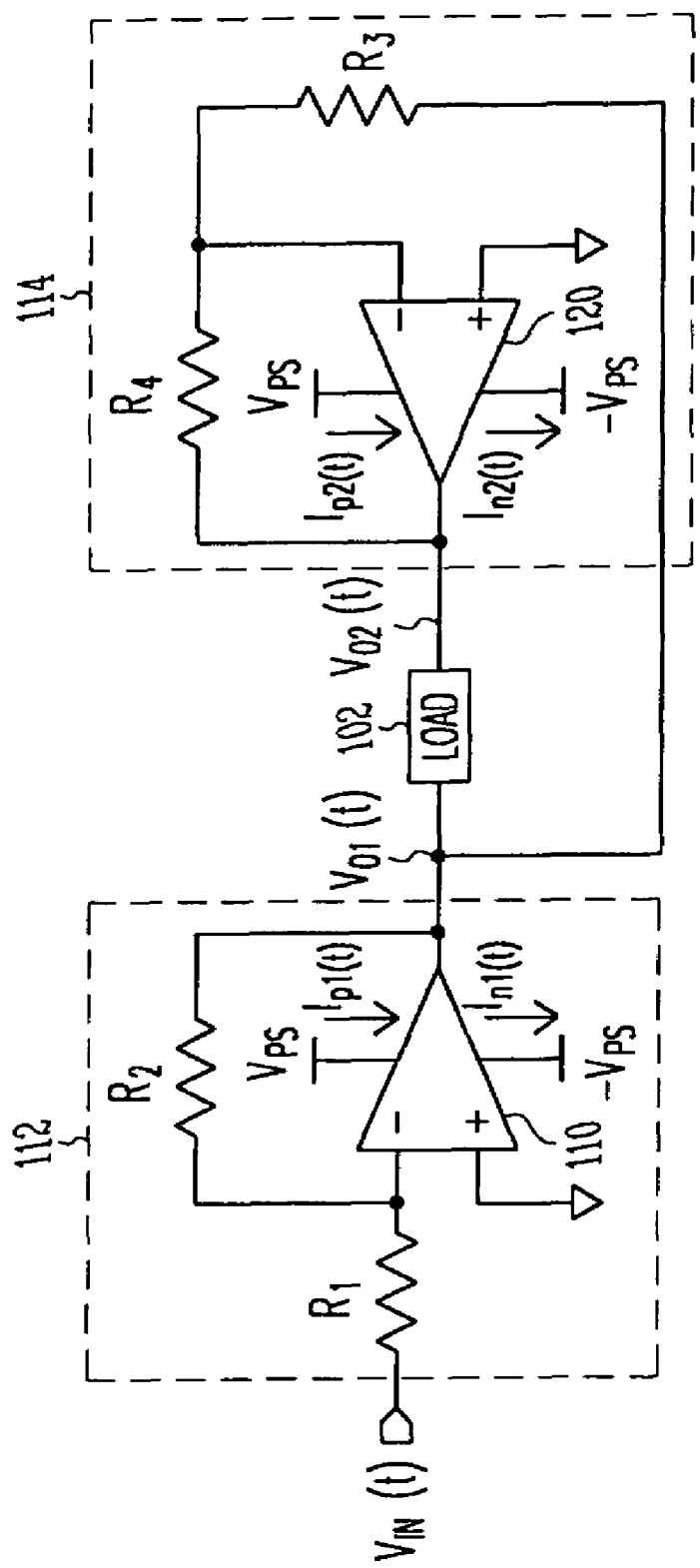
FIG. 1 illustrates a prior art audio amplifier employing two amplifiers to drive a load in a differential mode.
Figure 2A:
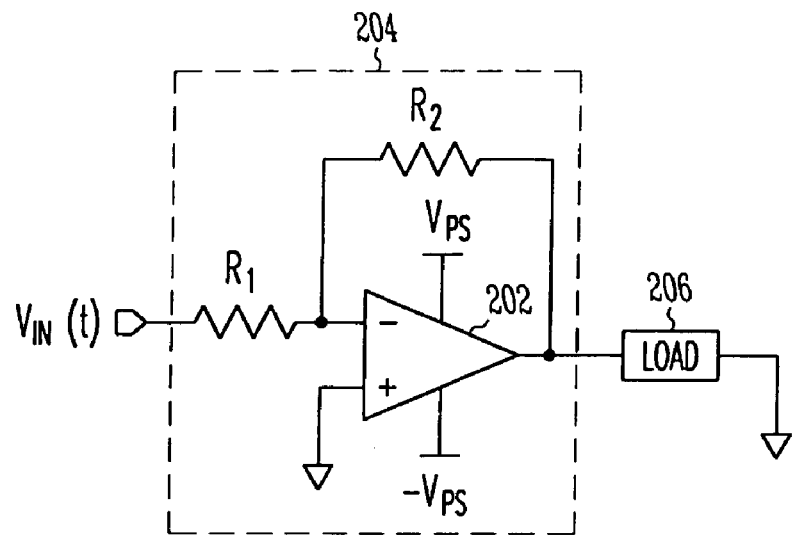
FIGS. 2a and 2b illustrates prior art audio amplifiers, each employing only one amplifier to drive a load.
Figure 2B:
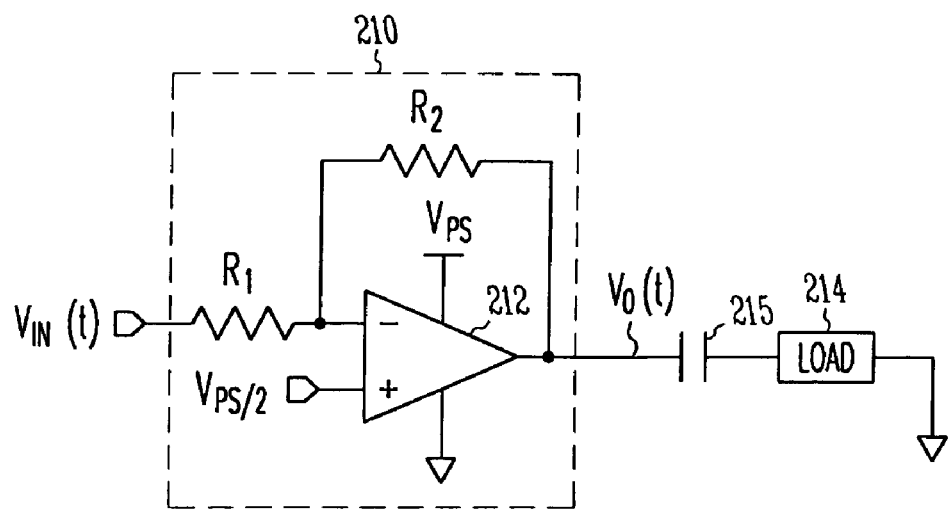
Figure 6:
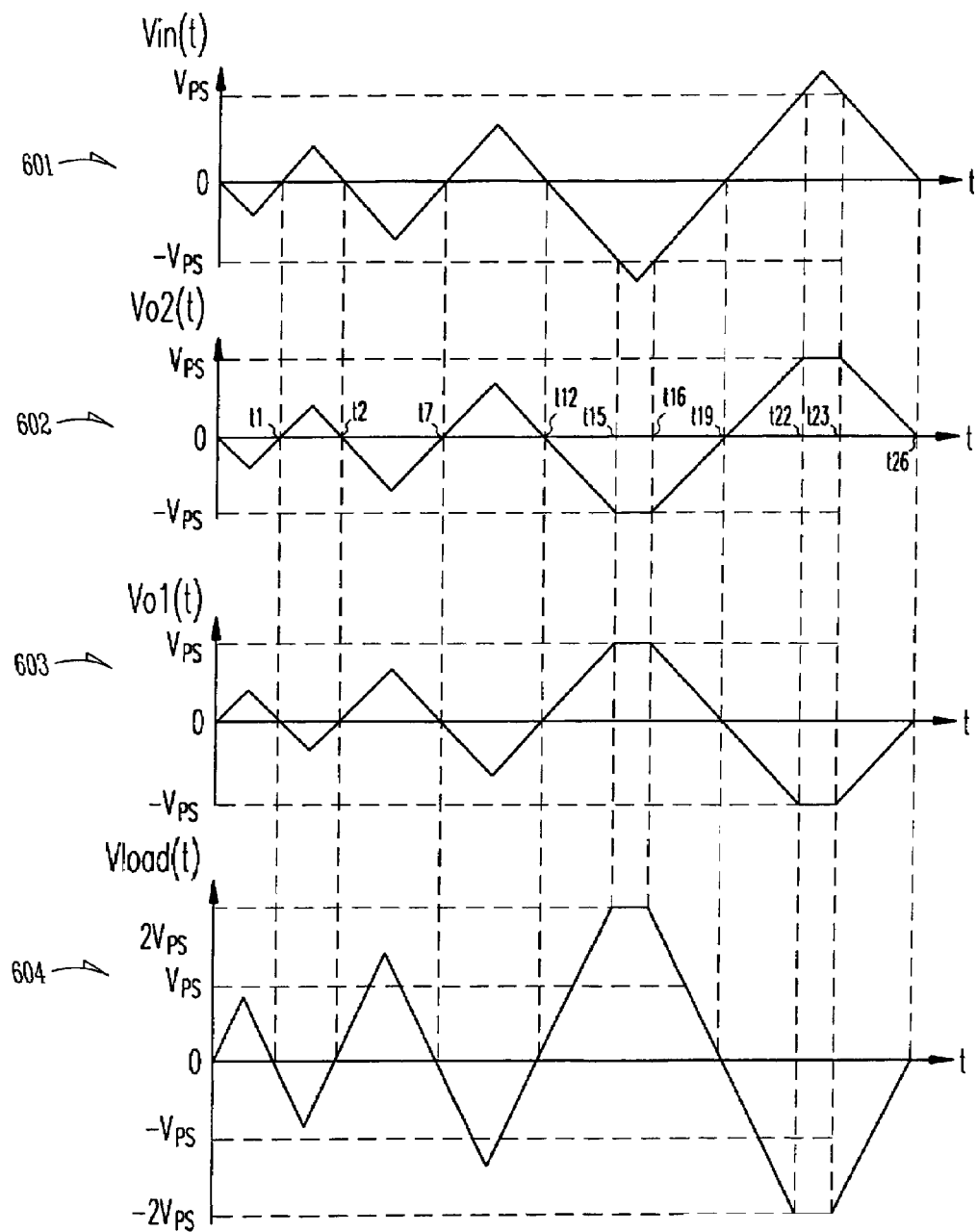
FIG. 6 illustrates simulated voltage waveforms for the prior art amplifier of FIG. 1.

In this simulation, plot 505 shows that load 408 is driven by an undistorted load voltage Vload(t) waveforms during the time periods of 0to t15, t16 to t22, and t23 to t26, which are amplified and inverted waveforms of input signal Vin(t), even though amplifier 410 is saturating during the time periods of t4 to t5, t9 to t10, t14 to t17, and t21 to t24. In a sense, the circuit of FIG. 4 amplifies its input signal in the same way as done by a conventional linear H bridge amplifier system as represented by FIG. 1. For comparison, simulated waveforms for a typical amplifier as represented by FIG. 1 are shown in FIG. 6. In FIG. 6, plot 601 is input signal Vin(t), plot 602 is output signal Vo2(t) of the amplifier 120, plot 603 is output signal Vo1(t) of amplifier 110, and plot 604 is the load voltage, denoted as Vload(t), across load 102, where Vload(t)=Vo1(t)−Vo2(t).

During the time periods of t15 to t16 and t22 to t23, amplifier 420 is saturated due to its input signal voltage, Vinp2(t), having too large an amplitude. Note that during these same time periods, it is seen from the plots in FIG. 6 that the load voltage applied to load 102 of FIG. 1 is also clipped. Consequently, for this simulation, the amplifier system of FIG. 4 generates the same output waveforms as those generated by the conventional system of FIG. 1.

It is instructive to compare the power usage of the prior art amplifier of FIG. 1 to the amplifier of FIG. 4, where the same input voltage signal is applied to both to generate the same output load voltage signal. In order for the two amplifiers to generate the same output load voltage signal from the same input voltage signal, the conventional linear H bridge amplifier of FIG. 1 has its resistor values (in Ohms) set as follows:

$$R1=10K, R2=10K, R3=10K, \text{ and } R4=10K.$$

Figure 7:
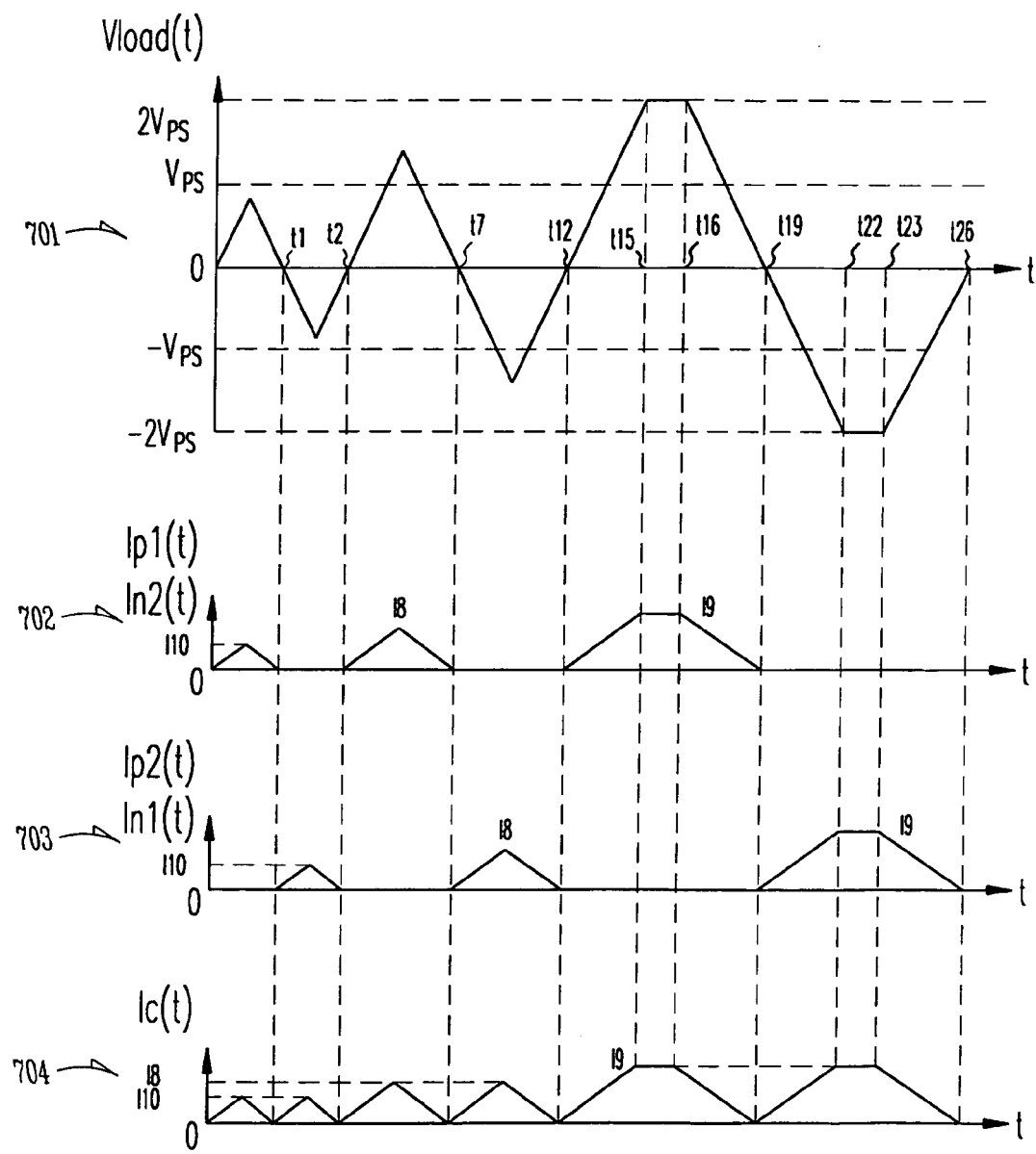
FIG. 7 illustrates simulated load voltage and corresponding power supply currents for the prior art amplifier of FIG. 1.

Various simulated waveforms for the H bridge amplifier of FIG. 1 are shown in FIG. 7. Plot 701 is the load voltage across load 102. It is the same plot as 604 of FIG. 6, and is reproduced in FIG. 7 for convenience. Plot 702 shows the positive power supply current for amplifier 110, denoted as Ip1(t), and also the negative power supply current for amplifier 120, denoted as In2(t). Plot 703 shows the positive power supply current for amplifier 120, denoted as Ip2(t), and also the negative power supply current for amplifier 110, denoted as In1(t). Plot 704 shows the total power supply current provided to the amplifiers, denoted as Ic(t), where I(t)=Ip1(t)+In1(t)+Ip2(t)+In2(t), which is proportional to the total power consumption of the amplifier circuit. (The "c" in "Ic(t)" is chosen as a mnemonic to mean the "conventional" circuit of FIG. 1.)

Figure 8:
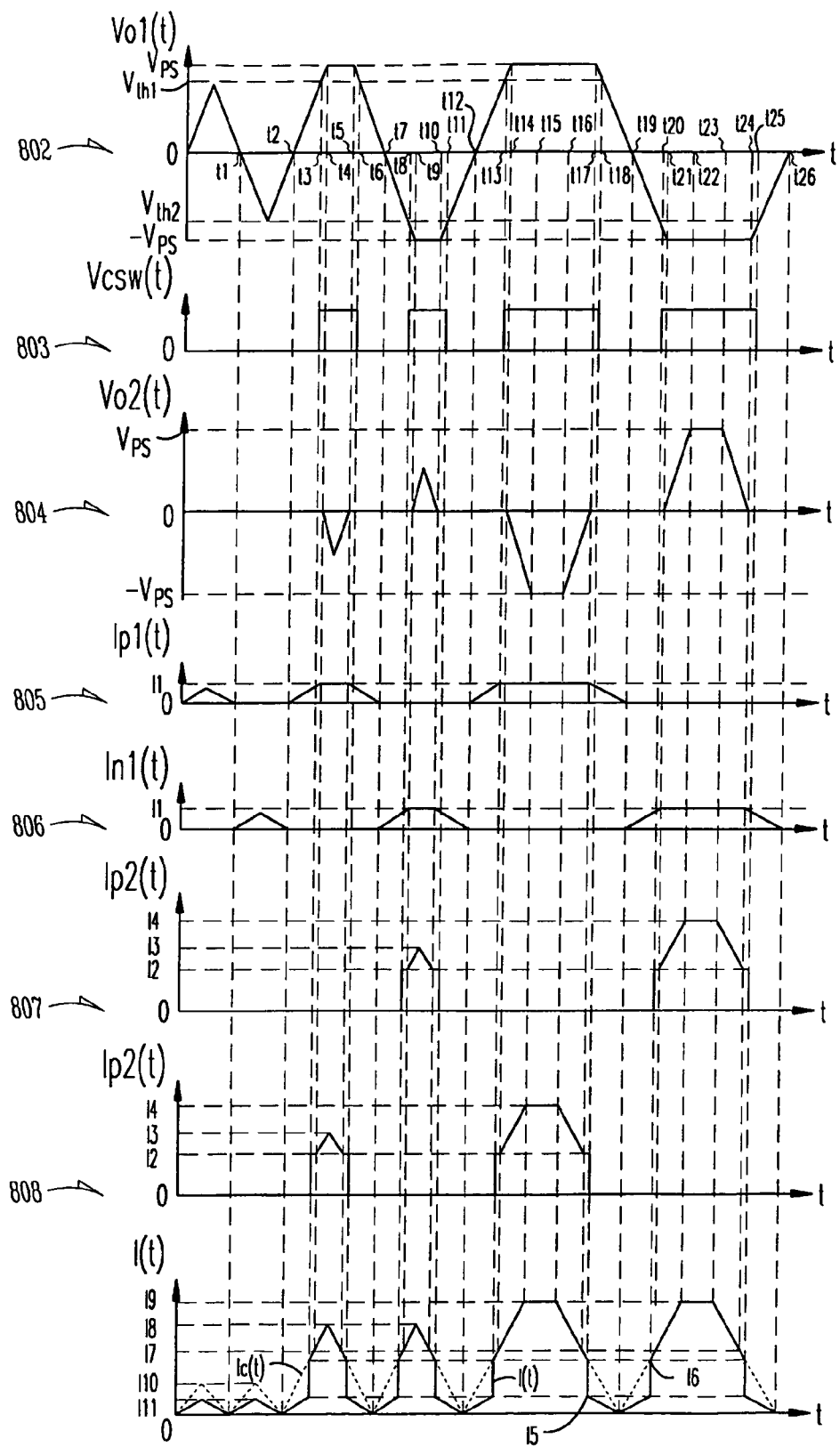
FIG. 8 illustrates simulated voltage and power supply currents for an embodiment of the present invention, with comparison to the prior art amplifier of FIG. 1.

Various simulated waveforms for the embodiment of FIG. 4 are shown in FIG. 8, where the input voltage and the resistors have the same values as used for the simulated waveforms presented in FIG. 5. For convenience, plots 502, 503, and 504 in FIG. 5 are shown again in FIG. 8 as plots 802, 803, and 804, respectively. For convenience, the same notation used for the supply currents indicated in FIG. 7 are also used for the supply currents indicated in FIG. 8, where now in FIG. 8, Ip1(t) shown in plot 805 is the positive power supply current for amplifier 410, In1(t) shown in plot 806 is the negative power supply current for amplifier 410, Ip2(t) shown in plot 807 is the positive power supply current for amplifier 420, and In2(t) shown in plot 808 is the negative power supply current for amplifier 420. There should be no cause for confusion because it will be clear from context the set of supply currents being referred to.

In FIG. 8, during the time periods 0 to t3, t6 to t8, t11 to t13, t18 to t20, and t25 to t26, amplifier 410 draws supply current as shown in plot 805 for Ip1(t) and in plot 806 for In1(t), but amplifier 420 does not draw any supply current as shown in plot 807 for Ip2(t) and in plot 808 for In2(t). Define the total supply current of the embodiment of FIG. 4 as I(t)=Ip1(t)+In1(t)+Ip2(t)+In2(t), where now Ip1(t), In1(t), Ip2(t), and In2(t) refer to the respective currents in FIG. 8. This current is shown in plot 809 in FIG. 8. To compare the total current of the conventional circuit of FIG. 1 to the embodiment of FIG. 4, we have also drawn in plot 809, as a dotted line, the current Ic(t) from the circuit of FIG. 1. From plot 809, it can be seen that during the periods 0 to t3, t6 to t8, t11 to t13, t18 to t20, and t25 to t26, I(t)=0.5*Ic(t). That is, during these timer periods, the circuit for the embodiment of FIG. 4 consumes only half of the total supply current as the conventional circuit of FIG. 2. During the time periods t3 to t6, t8 to t11, t13 to t18, and t20 to t25, I(t)=Ic(t), so that the embodiment of FIG. 4 consumes the same supply current as the circuit of FIG. 1.

The plots in FIG. 8 may be interpreted to mean that when amplifier 410 is not saturated (e.g., when the input signal's amplitude is not too large), the embodiment of FIG. 4 cuts the total power consumption by one-half when compared to the prior art circuit of FIG. 1. In practice, many signals, especially audio signals, have low amplitudes most of the time. Consequently, it is believed that for the embodiment of FIG. 4, when used to amplifier audio signals, there may be as much as an almost 50% savings in power consumed when compared to the prior art circuit of FIG. 1. Some real measurements have shown that for amplifying audio signals, the embodiment of FIG. 4 achieves a 50% power saving when the speaker volume is set low, and a 30% to 40% power savings when the speaker volume is set high, when compared with the conventional circuit of FIG. 1. For battery-powered systems, such as cell phones, MP3 players, portable DVD players, etc., this saving in power consumption may be significant.

Figure 9:
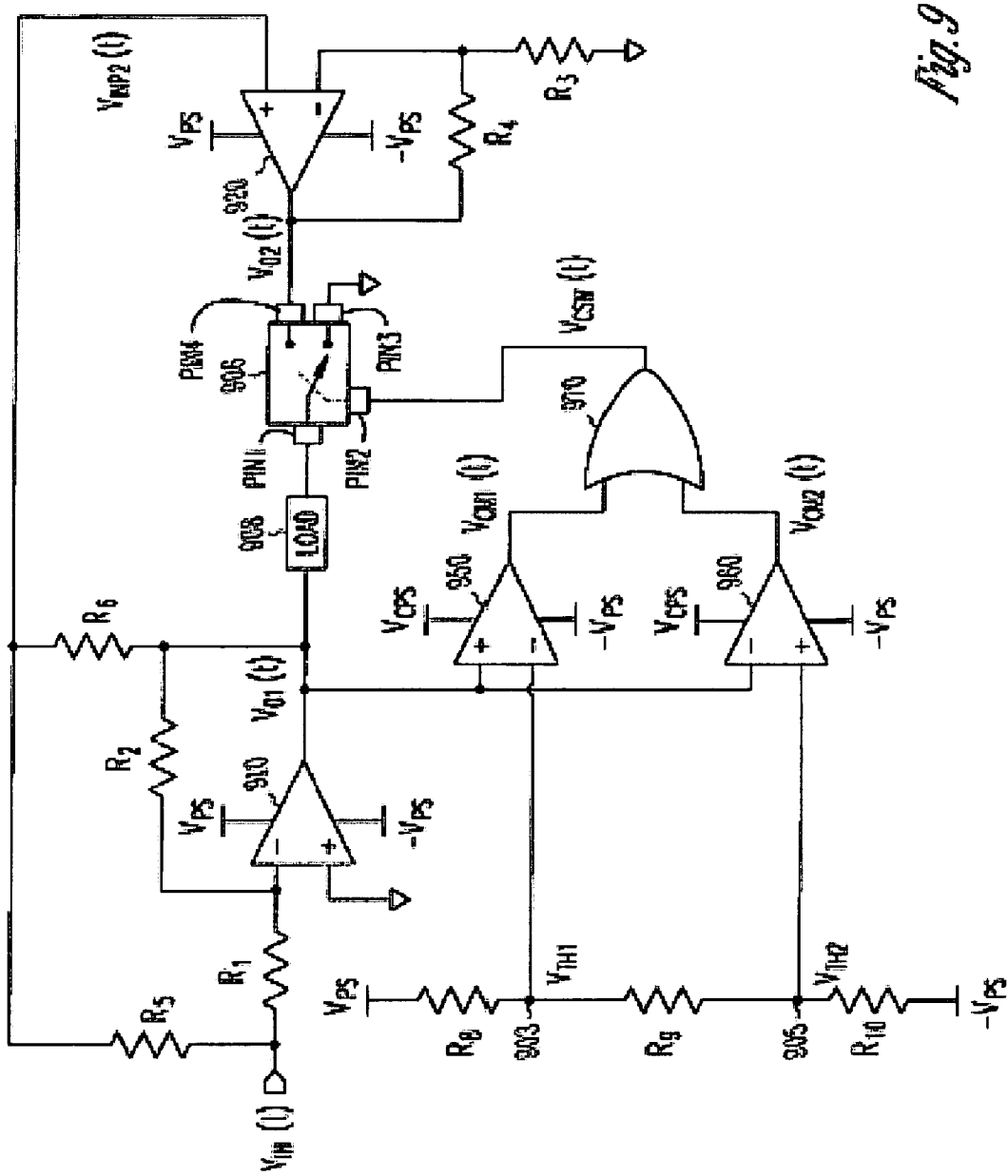
FIG. 9 illustrates another embodiment of the present invention, where the load driven by the amplifier is not coupled to a capacitor as in FIG. 4.

Another embodiment is shown in FIG. 9. Note that the circuit of FIG. 9 may be obtained by modifying the embodiment of FIG. 4 in which capacitor C1 and resistor R7 of FIG. 4 are eliminated, and where pin 3 of switch 406 in FIG. 4 is grounded. For the circuit of FIG. 9, the input signal Vin(t) has a zero time-average. For some embodiments, the resistor values indicated in FIG. 9 may be chosen to establish the following two conditions:

Condition (1): When the amplifier 910 is operating linearly, i.e., not saturated and not in pre-saturation, the variation in the voltage Vinp2(t) due to a variation in the voltage Vin(t) cancels the variation in the voltage Vinp2(t) due to a variation in the voltage Vo1(t). As for the embodiment in FIG. 4, this condition ensures that the output voltage of amplifier 920 is zero when amplifier 910 is operating linearly, i.e., when amplifier 910 is not saturated. Thus, load 908 receives the same signal when switch 906 is set in its "lower" position so that load 908 is connected to ground via pin1 and pin3, as when it is first connected to amplifier 920 due to amplifier 910 entering saturation.

Condition (2): When amplifier 910 is saturated, voltage gain G7, defined as $$G7 = \frac{\partial Vo2(t)}{\partial Vin(t)}, \tag{311}$$

is set equal in magnitude but opposite in polarity to gain G1, which was defined by eq. (1). That is, $$G7 = -G1. \tag{312}$$

Writing G7 has $$G7 = \frac{\partial Vo2(t)}{\partial Vin(t)} = \frac{\partial Vo2(t)}{\partial Vinp2(t)} * \frac{\partial Vinp2(t)}{\partial Vin(t)} = \left(1 + \frac{R4}{R3}\right) * \frac{1}{\frac{R5}{R6} + 1},$$

one obtains from G7=−G1 the relation $$\left(1 + \frac{R4}{R3}\right) * \frac{1}{\frac{R5}{R6} + 1} = \frac{R2}{R1}. \tag{313}$$

As discussed with respect to the embodiment of FIG. 4, conditions 1 and 2 ensure (approximately) that when amplifier 910 is saturated and switch 940 is switched to its "upper" position (common terminal pin1 is connected to pin 4), load 908 will receive from amplifier 920 that signal which has been clipped away by amplifier 910 due to its saturation.

With the above conditions in mind, the following is a procedure for determining the values of the resistors indicated in FIG. 9.

First, determine the gain for amplifier 910 according to the system needs so that R1 and R2 may be determined, where $$G1 = \frac{\partial Vo1(t)}{\partial Vin(t)} = -\frac{R2}{R1}. \tag{314}$$

Note that in theory these two resistors may have almost any values, as long as their ratio determines the desired gain. In practice, these resistor values range from the hundreds of Ohms to the hundreds of kilo Ohms, depending on the amplifier being used. A basic design rule to follow is that the lower the resistance, the lower the noise, and consequently the lower the error voltages caused by any bias currents. However, the lower the resistance, the higher the power consumed by the resistors. Accordingly, it is often found in practice that these resistor values are in the tens of kilo Ohms.

Second, derive an equation to meet the requirement listed in Condition 1 above as follows: The differential in the voltage Vinp2(t) due to a differential in the voltage Vin(t) is:

$$\delta Vinp2(t) = \frac{\delta Vin(t)}{\frac{R5}{R6} + 1}. \quad (315)$$

The differential in the voltage Vinp2(t) due to a differential in the voltage Vo1(t) is $$\delta Vinp2(t) = \frac{\delta Vo1(t)}{\frac{R6}{R5} + 1}. \quad (316)$$

From eq. (1), with amplifier 910 assumed to be operating linearly, we have $$\delta Vo1(t) = G1 * \delta Vin(t) = -\frac{R2}{R1} \delta Vin(t),$$

and combining this with eq. (316) gives $$\frac{\delta Vo1(t)}{\frac{R6}{R5} + 1} = \frac{-\frac{R2}{R1} \delta Vin(t)}{\frac{R6}{R5} + 1}. \quad (317)$$

Requiring the values of eqs. (315) and (317) to be the same in magnitude but opposite in polarity gives the following relationships $$\frac{\delta Vin(t)}{\frac{R5}{R6} + 1} = \frac{\frac{R2}{R1} \delta Vin(t)}{\frac{R6}{R5} + 1}, \quad (318)$$

$$\frac{1}{\frac{R5}{R6} + 1} = \frac{\frac{R2}{R1}}{\frac{R6}{R5} + 1},$$

and $$\frac{1}{\frac{R5}{R6} + 1} = \frac{\frac{R2}{R1}}{\frac{R6}{R5}\left(1 + \frac{R5}{R6}\right)}.$$

Which yields $$\frac{R6}{R5} = \frac{R2}{R1}.$$

Finally, derive an equation to meet condition (2) above as follows. From eq. (313), $$\left(1 + \frac{R4}{R3}\right) * \frac{1}{\frac{R5}{R6} + 1} = \frac{R2}{R1}, \quad (320)$$

and $$1 + \frac{R4}{R3} = \frac{R2}{R1} * \left(\frac{R5}{R6} + 1\right).$$

Combining with eq. (318):

$$1 + \frac{R4}{R3} = \frac{R6}{R5} * \left(\frac{R5}{R6} + 1\right) = 1 + \frac{R6}{R5}, \quad (322)$$

yielding $$\frac{R4}{R3} = \frac{R6}{R5}.$$

We may summarize the above description regarding the determination of a set of resistor values as follows. First, determine R1 and R2 by eq. (314) according to $$G1 = \frac{\partial Vo1(t)}{\partial Vin(t)} = -\frac{R2}{R1}. \quad (314)$$

Next, determine the ratio of R6 to R5 by eq. (318):

$$\frac{R6}{R5} = \frac{R2}{R1}. \quad (318)$$

Finally, determine the ratio of R4 to R3 by eq. (322):

$$\frac{R4}{R3} = \frac{R6}{R5}.$$

The above procedure may be illustrated by the following numerical example, where all resistances are in Ohms. Set G1=−2 by choosing for R2 and R1 the values, $$R2 = 20K,$$

and $$R1 = -\frac{R2}{G2} = 10K.$$

Next, set R5=10K, so that R6 is given by $$R6 = \frac{R2}{R1} R5 = 2 * 10K = 20K.$$

Calculate R4 and R3:

$$\frac{R4}{R3} = \frac{R6}{R5} = \frac{20K}{10K} = 2.$$

Finally, set R3=10K, so that

R4=2*10K=20K.

We now consider illustrative waveforms to describe the operation of the circuit in FIG. 9 using the above values for the resistances. (We assume that amplifiers 910 and 920 have rail-to-rail output capability for the illustrative waveforms. In practice, non-rail-to-rail output amplifiers may be employed.)

When the input signal, Vin(t), has its waveform as shown in plot 501 in FIG. 5, all the other waveforms for the circuit of FIG. 9 will be the same as those for the circuit of FIG. 4. That is, waveforms in plots 502 to 505 and plots 802 to 809 also apply to the circuit of FIG. 9. Consequently, the same discussion regarding the simulated waveforms for the circuit of FIG. 4 also applies to that of FIG. 9. Consequently, the power savings for the circuit of FIG. 9 will be the same as for the circuit of FIG. 4.

It is well know that a signal waveform having sharp "turning corners" in the time domain contains relatively very high frequency components. For example, the signal waveform in plot 502 for Vo1(t) at the time instances t4, t5, t9, t10, t14, t17, t21, and t24, and the signal wayeform in plot 504 for Vo2(t) at the time instances t15, t16, t22, and t23, exhibit such sharp turns in the time domain. In practice, these sharp turns are caused by saturation of the output stages of the amplifiers. When such waveforms travel through unshielded wires, EMI (Electro-Magnetic Interference) may be emitted.

Figure 10:
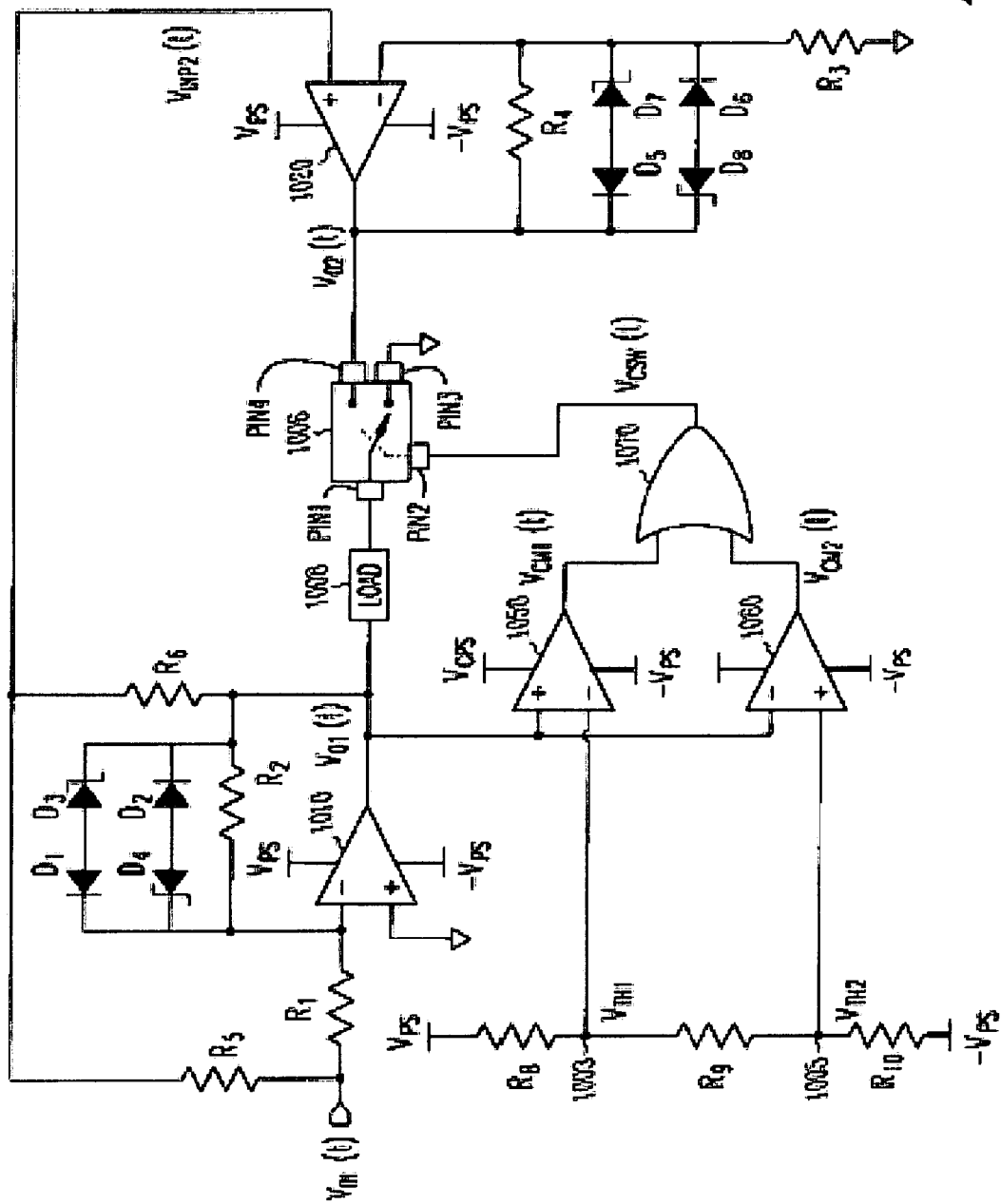
FIG. 10 illustrates a modification to the embodiment of FIG. 9, where diode arrays are employed to reduce high frequency components in the output voltage due to saturation.

In typical applications where the circuit in FIG. 4 or FIG. 9 is used to amplify audio signals, the two voltage signals Vo1(t) and Vo2(t) represent the amplifier output voltages applied to the speakers via unshielded speaker wires. As a result, EMI may result. To mitigate the EMI, the embodiment of FIG. 10 may be employed. The circuit of FIG. 10 is identical in structure to that of FIG. 9, except for the four diodes D1, D2, D5, and D6, and the four Zener diodes D3, D4, D7, and D8.

Figure 11A:
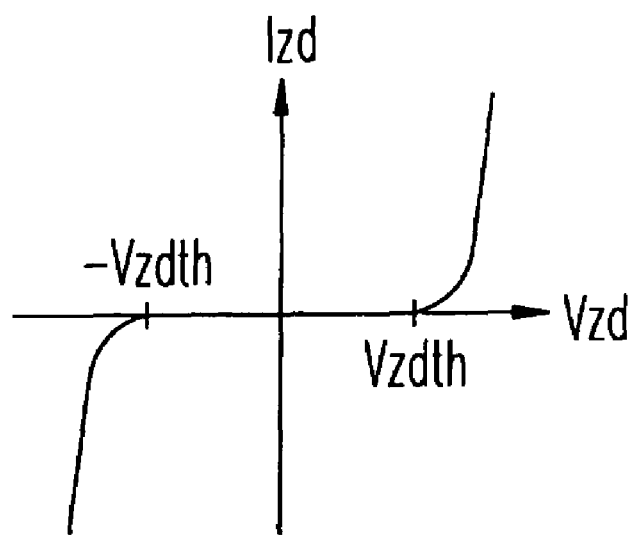
FIG. 11a illustrates the I-V (current-voltage) characteristic of a typical diode array as employed in the embodiment of FIG. 10.
Figure 11B:
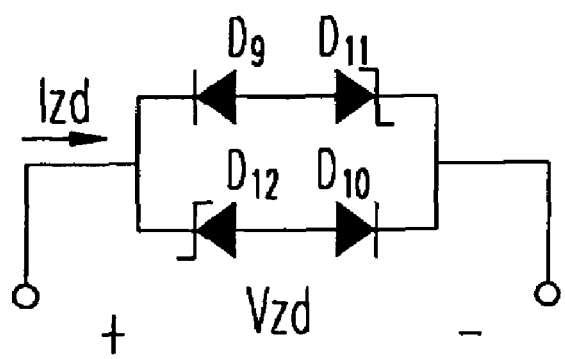
Figure 12:
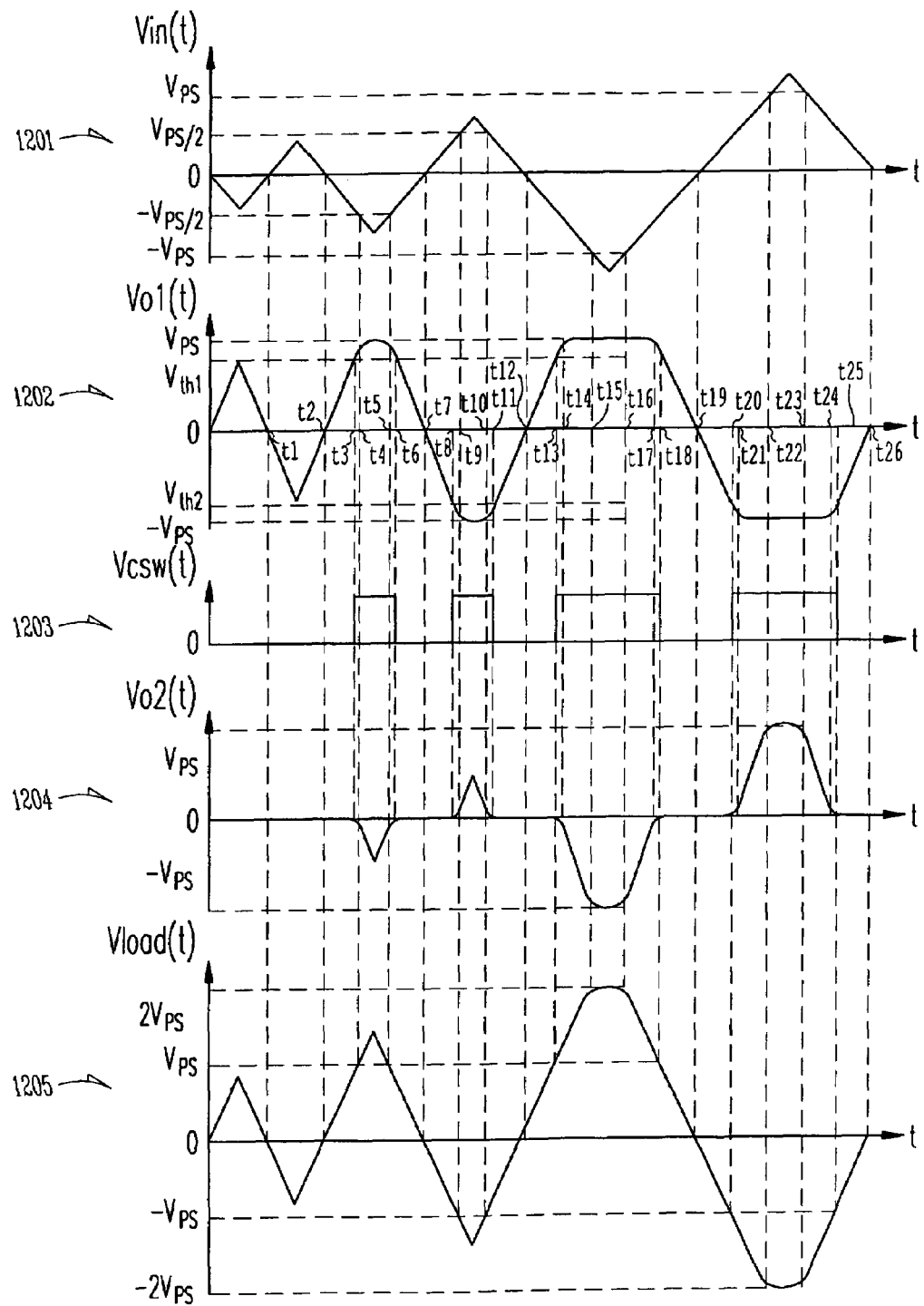
FIG. 12 illustrates simulated voltage waveforms for the embodiment of FIG. 10.

Devices D1, D2, D3, and D4 form a diode array connected across feedback resistor R2, and devices D5, D6, D7, and D8 form another diode array connected across feedback resistor R4. The I-V (current-voltage) characteristic of a typical diode array is shown in FIG. 11a, where the definitions for the diode array current, Izd, and voltage, Vzd, are inferred from the diode array of FIG. 11b. The same procedure for choosing resistance values for the circuit of FIG. 9 may also be applied to the circuit of FIG. 10, and simulated waveforms may be illustrated as done for the circuit of FIG. 9. Accordingly, because of the similarity in circuit topology between FIGS. 9 and 10, a detailed discussion for choosing the resistances need not be given. Simulated waveforms are shown in FIG. 12. Input voltage signal Vin(t) is shown in plot 1201 of FIG. 12, which is the same as that used for the previously described input voltage signals. As described with respect to the previous embodiments, plot 1202 shows the voltage Vo1(t), plot 1203 shows the voltage Vcsw(t), plot 1204 shows the voltage Vo2(t), and plot 1205 shows the voltage Vload(t) applied to load 1006. As seen from FIG. 12, the previously sharp corners caused by the saturations of the amplifiers, in this case amplifier 910 and 920, are smoothed out. As a result, it is expected that the EMI is reduced.

Because the diode arrays shunt feedback resistors R2 and R4, there is a reduction in the amplifier gains when the amplifier outputs are approaching their saturation voltages. Therefore, the diode array threshold voltage, Vzdth, as shown in FIG. 11a, should be slightly higher than the threshold voltage, Vth1, for comparator 1050. (We have assumed that the threshold voltages for comparators 1050 and 1060 satisfy |Vth1|=|Vth2|.)

There are numerous other methods to mitigate EMI, such reducing the gain of an amplifier when its output stage is approaching the power supply rails, resulting in a smoothing of the "saturation corners" of the waveforms. Using the diode arrays as shown in FIG. 10 is merely one method.

The previous embodiments described so far make use of two power supply voltages, denoted as Vps and −Vps, and are such that the input voltage signal, denoted as Vin(t), has a zero time-average. That is, the time-average of Vin(t) is at ground. However, embodiments may be realized in which only one power supply voltage, simply denoted as Vps, is needed. For such embodiments, the input voltage signal, again denoted by Vin(t), has a time-average equal to Vps/2. Such embodiments should make use of a capacitor so as not to consume unwanted static power, where the capacitor couples the load to ground when only one amplifier is driving the load. For example, such an embodiment is shown in FIG. 13.

Figure 13:
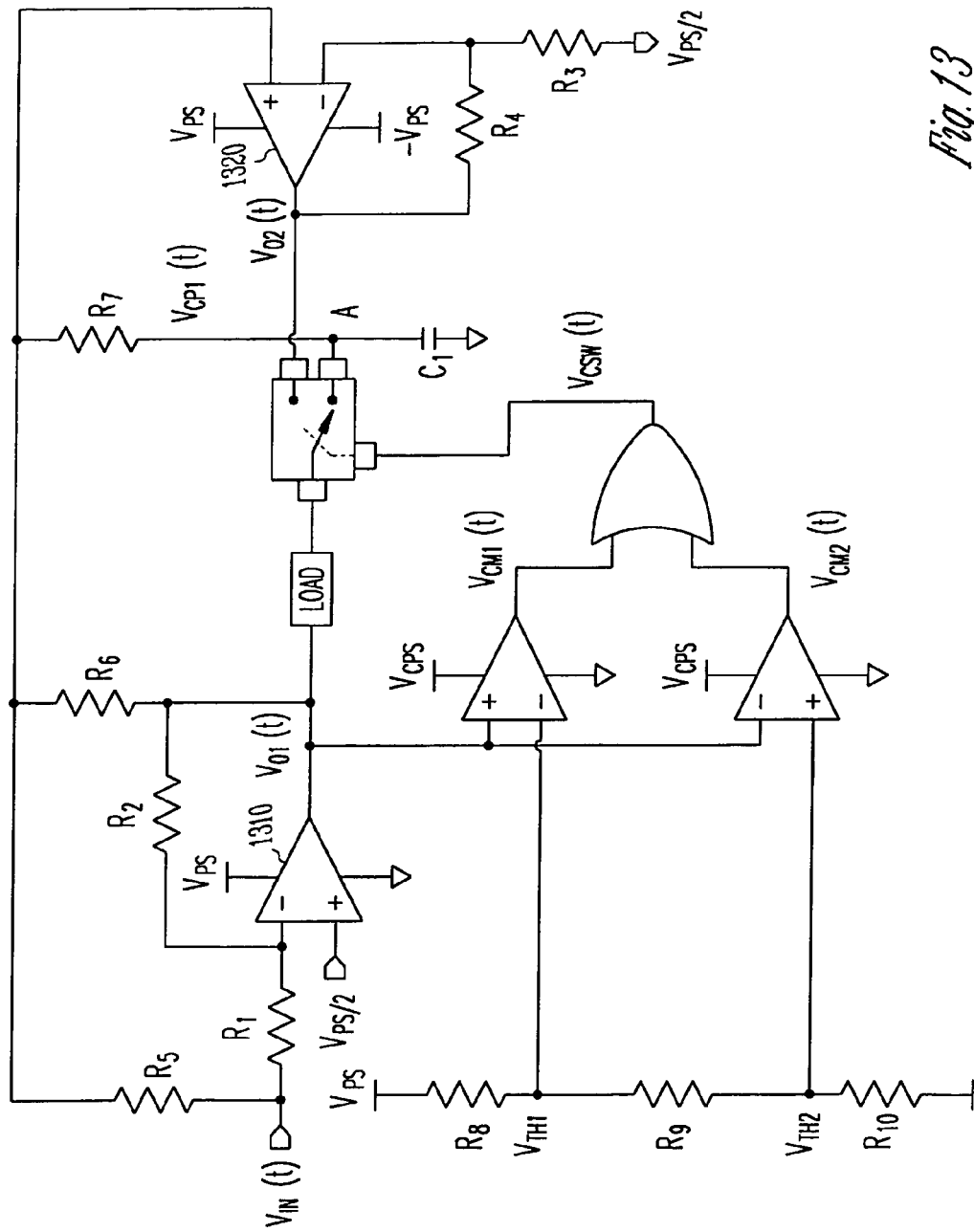
FIG. 13 illustrates another embodiment of the present invention in which only one power supply voltage is used.

Comparing the circuit of FIG. 13 to that of FIG. 9, it is seen that they have similar structures. However, amplifiers 1310 and 1320 require only one power supply to provide a voltage, Vps. Also, resistor R10 is now grounded instead of being connected to a negative power supply voltage as in FIG. 9. The input voltage signal Vin(t) indicated in FIG. 13 now has its time-average equal to Vps/2. Accordingly, the non-inverting port of amplifier 1310 and resistor R3 are biased at Vps/2. Resistors R8, R9, and R10 are chosen so that Vps>Vth1>Vth2>0. In practice, Vth1 is close to Vps and Vth2 is close to 0 (ground). For example, Vth1 may be set to 0.9 Vps volts and Vth2 may be set to 0.1 Vps volts.

Figure 14A:
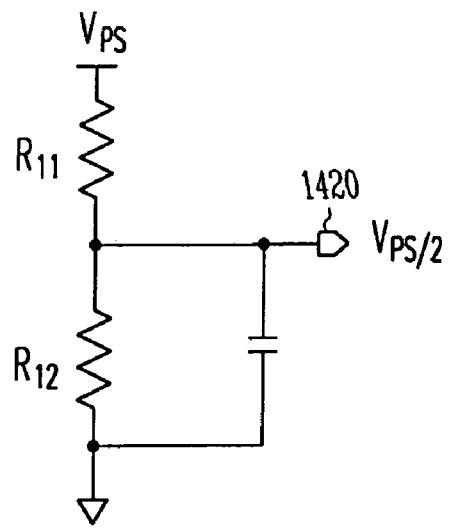
FIGS. 14a and 14b illustrate prior art circuits for generating a bias voltage needed for the embodiment of FIG. 13.
Figure 14B:
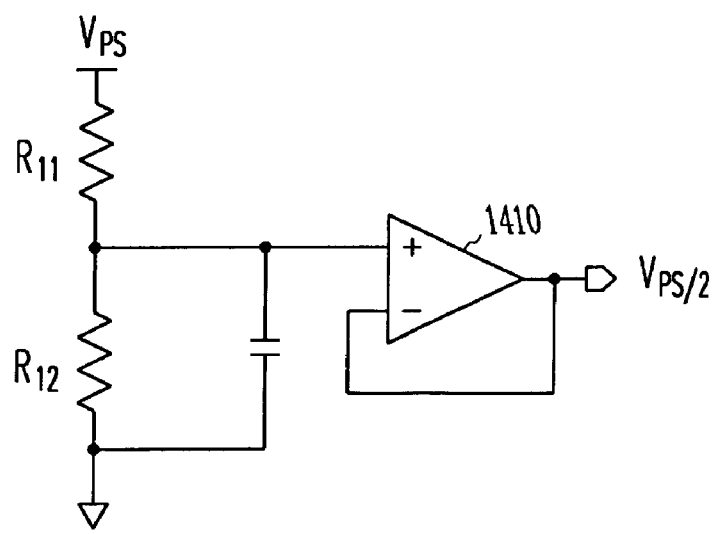

The bias voltage Vps/2 may be generated in numerous ways. For example. For example, FIG. 14a shows a circuit using a resistor divider comprising resistors R11 and R12, where the resistance values of R11 and R12 are chosen to be much smaller than that of R3, and are chosen small enough so that any bias current drawn by the non-inverting input of amplifier 1310 does not cause too much of a voltage change in the Vps/2 node 1420. FIG. 14b is a modification of the circuit in FIG. 14a in which OPAMP 1410 is configured as a buffer. As a result, this implementation does not necessarily require low resistances for R11 and R12. The circuit in FIG. 14a may be more frequently used in PCB (Printed Circuit Board) form designs, but the circuit in FIG. 14b may be more suitable, and can easily be implemented in IC (Integrated Circuit) form designs.

The operation of the circuit and choice for the method for choosing resistance values R1, R2, R3, R4, R5, R6, and R7 are similar to that of FIG. 4, and consequently a detailed description is not needed to practice the disclosed embodiments.

The choice for the capacitance of C1 should be such that it provides a low impedance to ground for the frequency range of interest. For example, for audio applications, if it is desirable to have good fidelity in the lower frequency ranges, then the capacitance for capacitor C1 in the embodiment of FIG. 13 may be chosen as large as is practical. But for small, portable devices, such as audio amplifiers in battery-powered consumer devices, too large of a capacitor would make the device unwieldy and not marketable. Switched-capacitor circuits may be employed so that a relatively low effective impedance is provided for good fidelity, but where the actual capacitances are relatively small.

Figure 15A:
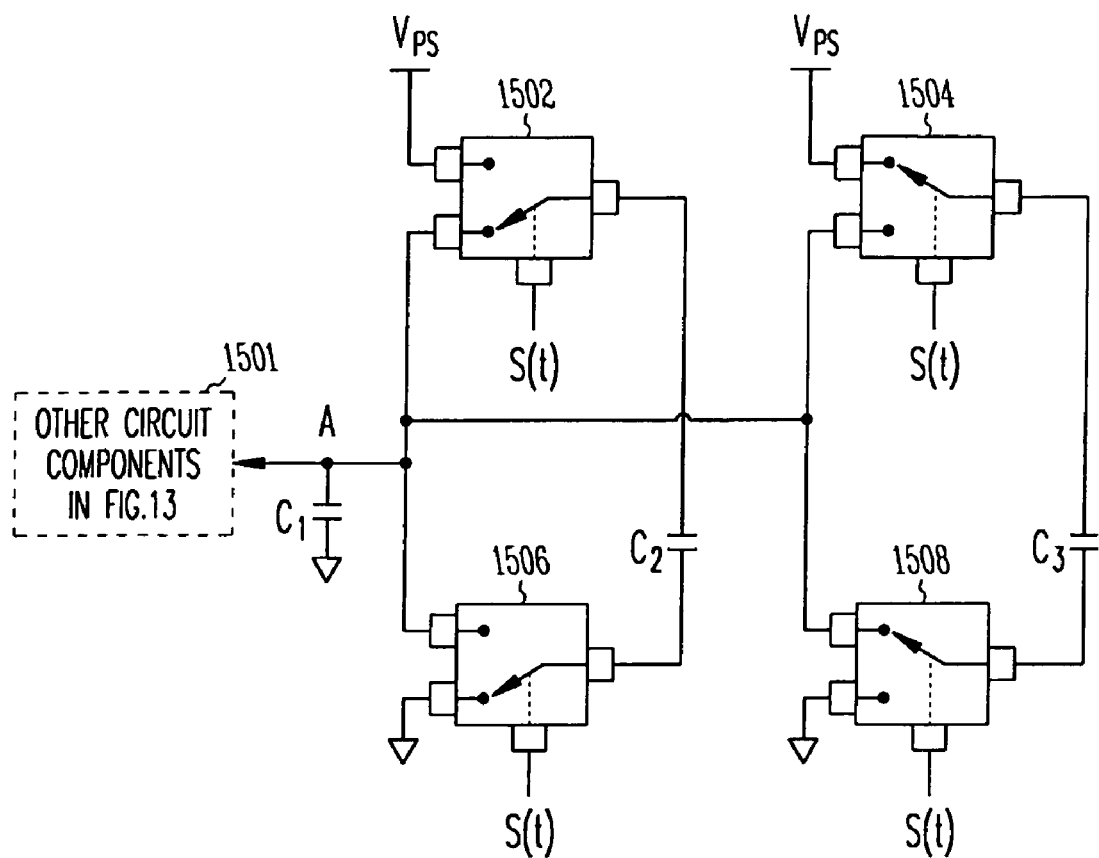
FIG. 15a is an embodiment in which a switched-capacitor circuit is used with the embodiment of FIG. 13 so as to provide a relatively large effective capacitance for augmenting the output coupling capacitor.

An embodiment in which a switched-capacitor is employed to increase the effective capacitance is illustrated in FIG. 15a. Node A in FIG. 15a is to be identified with node A in FIG. 13, and capacitor C1 in FIG. 15a is to be identified with capacitor C1 in FIG. 13, so that box 1501 indicates the other components of FIG. 13. Switches 1502, 1504, 1506, and 1508 switch capacitors C2 and C3 in parallel with capacitor C1. These switches are controlled by switch logic signal s(t).

Figure 15B:
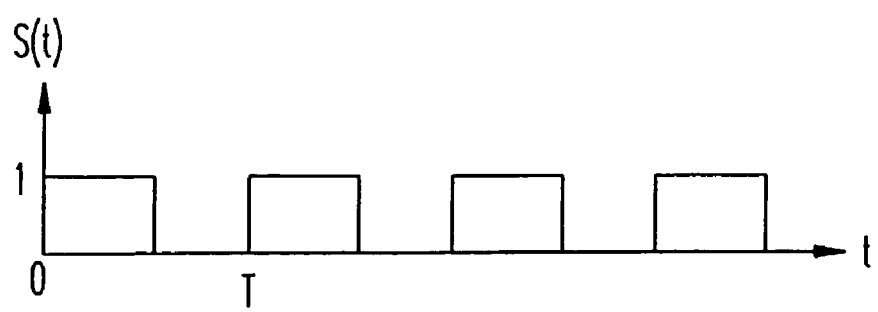

A typical waveform representing s(t) is given in FIG. 15b, indicating a period of T seconds and a duty cycle of 50%. Each switch toggles between its two states depending upon whether s(t) is a logic LOW or a logic HIGH. The switches are configured so that when switches 1502 and 1506 are in their "lower" positions, switches 1504 and 1508 are in their "upper" positions, and conversely, when switches 1502 and 1506 are in their upper positions, switches 1504 and 1508 are in their lower positions. In this way, for any given switching period, for one-half of the switching period capacitor C2 is connected from node A to the power supply rail at voltage Vps and capacitor C3 is connected from node A to ground; and for the other half of the switching period capacitor C2 is connected from node A to ground and capacitor C3 is connected from node A to the power supply rail.

The above description of the switched-capacitor circuit may be visualized by referring to FIGS. 16a and 16b. FIG. 16a shows the circuit connections when switches 1502 and 1506 are in their lower positions, and when switches 1504 and 1508 are in their upper positions. We will refer to FIG. 16a as the first switch state. FIG. 16b shows the circuit connections when switches 1502 and 1506 are in their upper positions, and when switches 1504 and 1508 are in their lower positions. We will refer to FIG. 16b as the second switch state. In FIGS. 16a and 16b, the terminals of capacitors C2 and C3 have been labeled with a "U" or a "L" to show how the terminals are connected. A "U" terminal is an "upper" terminal when viewing the corresponding capacitor symbol in FIG. 15a. Similarly, a "L" terminal is a "lower" terminal when viewing the corresponding capacitor symbol in FIG. 15a.

Referring now to FIG. 13, if C1 were an ideal capacitor with unlimited capacitance and if the input voltage Vin(t) had a time-average equal to Vps/2, then under ideal conditions the time-average of the node voltage at node A would be held at Vps/2. Consequently, in practice, it is desirable for the switched-capacitor circuit to try holding the time-average voltage at node A at Vps/2. By considering the two states in FIGS. 16a and 16b, we see how the switched-capacitor circuit in FIG. 15a tries to achieve this goal. For example, assume that initially all capacitors are charged to have a potential difference of Vps/2. Suppose the circuit were in the first switch state of FIG. 16a. If the voltage at node A were to suddenly start to rise above Vps/2, then capacitors C1 and C2 would receive excess charge (i.e., will charge up to a voltage difference greater than Vps/2) and C3 would lose charge (i.e., be discharged to a voltage difference less than Vps/2). Then when the switched-capacitor circuit enters the second switch state of FIG. 16b, capacitors C1 and C2 dump some of their charge to capacitor C3, thus restoring to some degree their initial states of having equal potential differences of Vps/2. In this way, the switched-capacitor circuit tries to maintain a time-average voltage of Vps/2 on capacitor C1. A similar argument may be made for the case in which the voltage at node A suddenly starts to fall below Vps/2.

In this way, the switched-circuit emulates a relatively low effective impedance that is significantly lower than the impedance of the sum of the actual physical capacitances of capacitors C2 and C3. The capacitances of capacitors C2 and C3 may, but need not, be chosen to be equal to each other. Furthermore, from the symmetry of their roles, it is seen that the switched-capacitor circuit in FIG. 15a may be modified in which switches 1504 and 1508, and capacitor C3, are removed. Also, the duty cycle for s(t) need not be 50%.

In practice, the one-sided spectral power density for Vin(t) is limited to some finite frequency range, say in the range 0 to B Hertz. The switching frequency of s(t) should be chosen high enough so that it is significantly higher than the high end of this range of frequencies. For example, the switching frequency may be chosen to be 10 KHz when audio signals are to be amplified.

Various modifications may be made to the disclosed embodiments without departing from the scope of the invention as claimed below. For example, the embodiments of FIG. 4 or FIG. 13 may be modified to include the diode arrays of FIG. 11, where one diode array is connected in parallel with resistor R2 and another is connected in parallel with resistor R4.

As another example, the amplifier circuits described above may share the same capacitor C1. That is, referring to FIG. 13, this circuit, excluding capacitor C1, may be replicated to drive another load, such as a speaker belonging to a pair of headphones. The resulting circuit is then two separate amplifiers, each with a different input signal, such as the left and right channels of a stereophonic audio signal, where each amplifier drives a separate speaker and both amplifiers shares the capacitor C1. For such an embodiment, the switching-capacitor circuit in FIG. 15a may also be added so as to connect to node A.

As another example, referring to FIG. 3a, output port 312a of amplifier 304a may be coupled directly to load port 334a, instead of via switch 306a, in which case controller 314a controls amplifier 304a so that it does not drive load 308a when switch 306a is in its first state but drives load 308a when switch 306a is in its second state.

Figure 18:
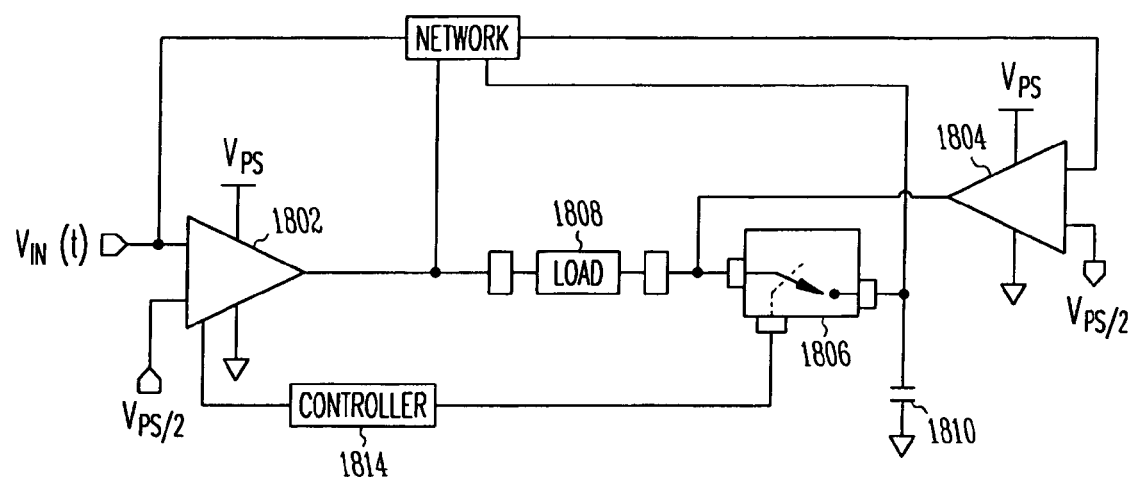
FIG. 18 is another embodiment of the present invention.

For example, referring to FIG. 18, amplifier 1804 has its output port coupled directly to load 1808 (perhaps via a load port) instead of coupled to a switch. Controller 1814 controls amplifier 1804 so that amplifier 1804 is not driving load 1808 when switch 1806 is coupling load 1808 to capacitor 1810, but amplifier 1804 is controlled to drive load 1808 when switch 1806 is not coupling load 1808 to capacitor 1810.

Controller 1814 may control amplifier 1804 in various ways, and such methods are well knows to those skilled in the art of amplifiers. For example, a bias current for amplifier 1804 may be adjusted so that amplifier 1804 is put into an active mode to drive load 1808 when the bias current is at some nominal level, and where amplifier 1804 is put into an inactive mode when the bias current is at zero, or close to zero.

Observe that in FIG. 18, controller 1814 is shown coupled to amplifier 1802 in a general way, rather than coupled directly to its output port. That is, for some embodiments, controller 1814 may monitor a measurable quantity other than the output voltage of amplifier 1802. For example, the input voltage Vin(t) may be monitored, or internal voltages or currents within amplifier 1802 may be monitored.

More generally, controller 1814 monitors one or more quantities, and a logic signal is outputted in response to the one or more quantities so that amplifier 1804 is either driving load 1808 or not driving load 1808. That is, a binary decision is made based upon one or more monitored quantities. Such a binary decision may be described by first introducing some notation.

Let $x_1(t), x_2(t), \ldots, x_n(t)$ denote n measurable quantities upon which a binary decision is made. The ordered set $(x_1(t), x_2(t), \ldots, x_n(t))$ may be thought of as a point in n-dimensional real space. (The n-dimensional real space is usually denoted as $I^n$.) During circuit operation, each of these quantities will have some range, so that the point $(x_1(t), x_2(t), x_n(t))$ defines a region in n-dimensional real space as each quantity is allowed to vary over its range of values. This region will be referred to as the operating region of amplifier 1802. Let R denote a region that is a proper subset of the operating region. (That is, R is not the entire operating region.). Let D denote a decision, e.g., the decision D is that amplifier 1804 is not driving load 1808. Let D# denote the logical complement of D. (For example, D# is the decision that amplifier 1804 is driving load 1808.) With this notation in mind, a memoryless decision function may be represented as follows: At time t, choose decision D if $(x_1(t), x_2(t), \ldots, x_n(t))$ lies in the region R, otherwise, choose decision D#. Embodiments of the present invention are not necessarily limited to memoryless decisions.

For a specific example of the above discussion regarding a general decision function, referring to FIG. 18, suppose decision D is the state for which amplifier 1804 is not driving load 1808 and switch 1806 is coupling load 1808 to capacitor 1810. The measured quantity may be Vin(t), and the region R may be the interval [Vps/2−Vth, Vps/2+Vth] where 0<Vth<Vps/2. In practice, the region R may not necessarily be the entire region for which amplifier 1802 is operating linearly. The conditions under which amplifier 1802 is operating linearly may not be precisely known, and may vary from die to die due to process variation. Accordingly, a conservative approach may be taken in which the region R is a proper subset of the region for which amplifier 1802 is linear. In other words, that portion of the operating region outside of the region R may represent quantities $x_1(t)$, $x_2(t), \ldots, x_n(t)$ for which amplifier 1802 is linear, is in pre-saturation, or is in saturation. In practice, to save power, the region R may be chosen to include most of the region for which amplifier 1802 is operating linearly.

More generally, from the above description of some of the embodiments, it is seen that various quantities of a first amplifier are measured or monitored, thereby defining an operating region. When the various monitored quantities are in a region R, where R is a proper subset of the operating region, a second amplifier is controlled so as to not drive the load. This may be accomplished by disconnecting the output port of the second amplifier from the load by way of a switch, or by putting the second amplifier in a mode in which little power is consumed and for which it does not drive the load. When the various monitored quantities are not in the region R, the second amplifier is controlled so as to drive the load.

It should be appreciated that when the second amplifier is put into an inactive mode in which it does not drive the load, the second amplifier may consume some power, and a relatively small amount of power may nevertheless be delivered to the load. However, the second amplifier does not drive the load in the sense that any power delivered to the load by the second amplifier is negligible compared to what it is capable of delivering to the load. Accordingly, in the claims, stating that the second amplifier does not appreciably drive the load is meant to reflect the situation where any power delivered to the load by the second amplifier is negligible compared to the power that it is capable of delivering to the load.

Figure 19:
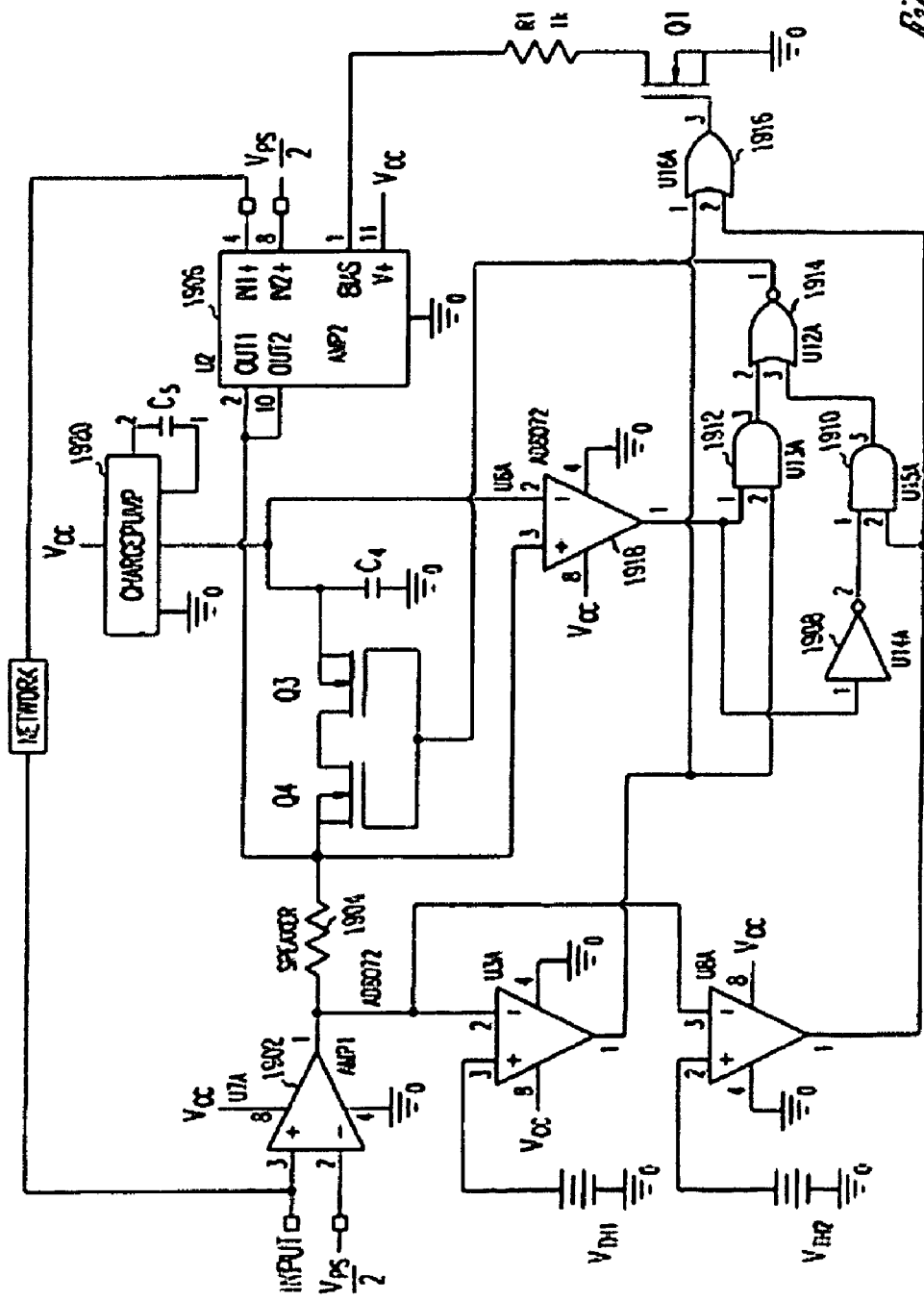
FIG. 19 is yet another embodiment of the present invention.

Another embodiment is illustrated in FIG. 19. Amplifier 1902 drives load 1904, and amplifier 1906 is connected to load 1904 so as to drive load 1904 when active, and to not appreciably drive load 1904 when inactive. A bias current to amplifier 1906 is controlled by transistor Q1. When the output voltage of amplifier 1902 is inside the voltage window defined by Vth1 and Vth2, that is, when the output voltage Vo1(t) is such that Vth2<Vo1(t)<Vth1, then the combination of logic gate 1916 drives transistor Q1 OFF, so that amplifier 1906 is starved of bias current and is put into an inactive mode. When the output voltage Vo1(t) falls outside the window defined by Vth2 and Vth1, then logic gate 1916 drives transistor Q1 ON, so that bias current is provided to amplifier 1906 so that it is now actively driving load 1904.

In the embodiment of FIG. 19, module 1920, denoted as a charge-pump, may be switched-capacitor circuit the FIG. 15a, so as to provide a low impedance to load 1904 when switching transistors Q3 and Q4 are ON.

Note that transistors Q4 and Q3 serve as the switch for connecting capacitor C4 to load 1904. The gate of the switch (transistors Q4 and Q3) is controlled by NOR gate 1914, where one side of the switch is connected to the inverting input port of comparator 1918 and the other side is connected to the non-inverting input port of comparator 1918. When the output voltage of amplifier 1902 goes outside the voltage window [Vth1, Vth2], capacitor C4 is not immediately switched out. However, with the arrangement of comparator 1918 with logic gates 1908, 1910, 1912, and 1914, as amplifier 1906 is powered-up into its active mode, the current through the switch will decrease. As this current decreases, the magnitude of the voltage drop across the switch will decrease, and when it decreases to a small enough value, comparator 1918 will trip, causing logic gate 1914 to turn OFF transistors Q4 and Q3. Comparator 1918 may have a threshold that is substantially zero, as shown in FIG. 19, or a small value close to zero.

In this way, when amplifier 1906 is powered-up into its active mode, there is a delay before capacitor C4 is disconnected from load 1904. Other embodiments may employ a module to implement a delay between activating amplifier 1906 and switching out the capacitive load. This procedure is illustrated in the flow diagram of FIG. 20. In module 2002, the output voltage of the (first) amplifier driving the load is monitored. If it falls outside the voltage window, then module 2004 puts the second amplifier into an active mode. A delay is introduced by module 2006, after which the capacitive load is switched out in module 2008. Module 2010 again monitors the output voltage of the first amplifier, and if it falls within the voltage window, then in module 2012 the second amplifier is deactivated and the capacitive load is switched to the load, and control is brought back to module 2002.

Figure 20:
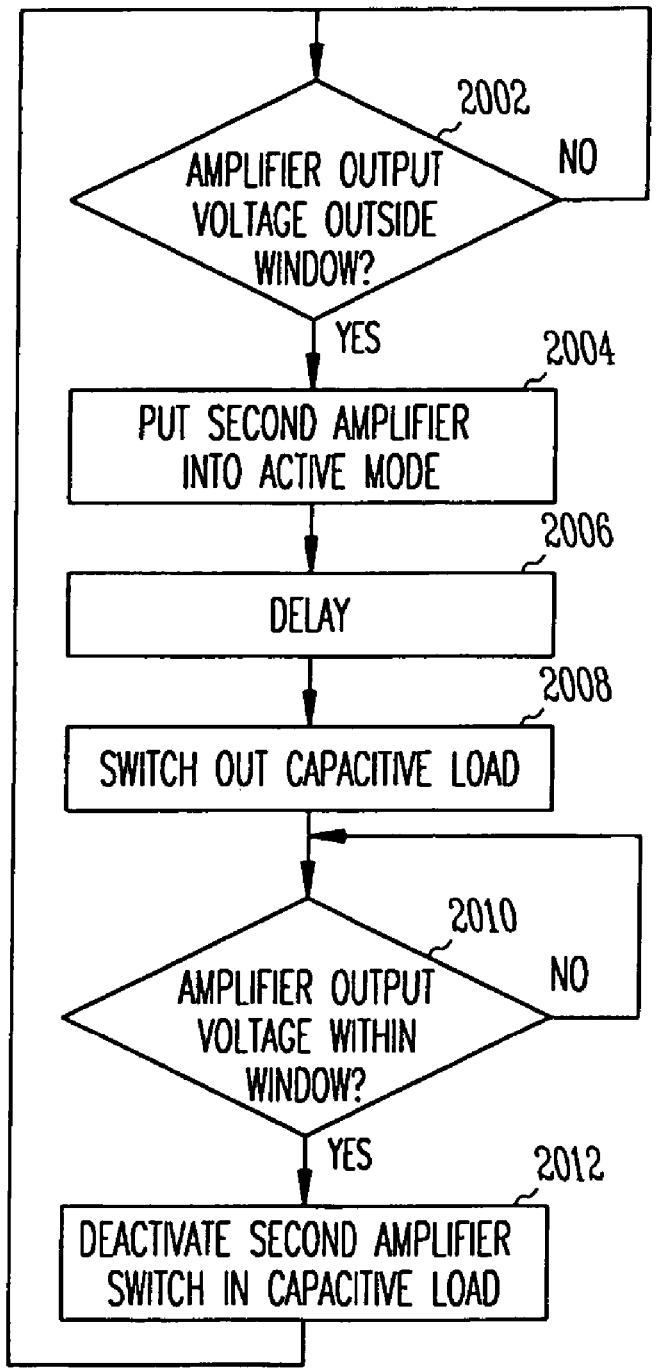
FIG. 20 illustrates a flow diagram according to an embodiment of the present invention.

The flow diagram of FIG. 20 is a conceptual way to describe the actions of a circuit. The modules in FIG. 20 may represent various sub-circuits, and a sub-circuit may provide the functions of more than one module.

Throughout the description of the embodiments, equalities, or the like, were used in various equations or in various descriptions. For example, a gain may have been set to equal one, or a voltage at one node may have been set to equal a voltage at another node, or the variations in a node voltage due to variations in a first voltage were set to cancel the variations in the node voltage due to variations in a second voltage. Of course, these equalities, or the like, are in practice not satisfied exactly, and should therefore be interpreted as "designed for" equalities, or the like. That is, one of ordinary skill in the art may design various working embodiments to satisfy various conditions, but these conditions can only be met within the tolerances of the technology available to the practitioner. Accordingly, in the following claims, the word "substantially" is used to reflect this fact. For example, a claim may recite that one resistance is substantially equal to another resistance, or that one voltage is substantially equal to another voltage. It is to be understood that "substantially" is a term of art, and is meant to convey the principle discussed above that equalities, or the like, cannot be met with exactness, but only within the tolerances of the technology available to a practitioner.

Furthermore, it is to be understood in these letters patent that the meaning of "A is connected to B", where A or B may be, for example, a node or device terminal or port, is that A and B are connected to each other so that the voltage potentials of A and B are substantially equal to each other. For example, A and B may be connected by way of an interconnect, transmission line, etc. In integrated circuit technology, the "interconnect" may be exceedingly short, comparable to the device dimension itself. For example, the gates of two transistors may be connected to each other by polysilicon or copper interconnect that is comparable to the gate length of the transistors. As another example, A and B may be connected to each other by a switch, such as a transmission gate, so that their respective voltage potentials are substantially equal to each other when the switch is ON.

It is also to be understood that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements. For example, A may be connected to a circuit element, which in turn is connected to B.

Various logical relationships may be claimed. As customary in logic, "A only if B" means "if A is true, then B is true"; "A if B" means "if B is true, then A is true"; and "A if and only if B" means "if A is true, then B is true; and if B is true, then A is true."

It is also to be understood that various circuit blocks, such as current mirrors, amplifiers, etc., may include switches so as to be switched in or out of a larger circuit, and yet such circuit blocks may still be considered connected to the larger circuit because the various switches may be considered as included in the circuit block.

What is claimed is:

1. A circuit comprising:
a first load port and a second load port;
a first amplifier comprising an output port coupled to the first load port, the output port having an output voltage Vo1(t), the first amplifier further comprising an input port having an input voltage Vin(t);
a second amplifier comprising an output port and an input port having an input voltage Vin2(t);
a capacitive impedance; and
a switch to couple the capacitive impedance to the second load port only when the switch is in a first state, the circuit to put the switch into its first state when the output voltage is within an operating range;
wherein the first amplifier is coupled to the second amplifier so that [.delta.Vin2(t)/.delta.Vin(t)] is substantially equal to the negative of [.delta.Vin2(t)/.delta.Vo1(t)][G1], where G1 is the gain of the first amplifier.

2. The circuit as set forth in claim 1, the capacitive impedance having a voltage drop Vcp(t), the output port of the second amplifier having an output voltage Vo2(t), wherein the capacitive apparatus is coupled to the second amplifier such that .delta.Vo2(t)/.delta.Vcp(t) is substantially equal to one.

3. The circuit as set forth in claim 1, the second amplifier having an active mode, the circuit to put the second amplifier into its active mode when the output voltage is outside the operating range, and to put the second amplifier out of its active mode when the output voltage is within the operating range.

4. The circuit as set forth in claim 3, the circuit to put the switch into its second state after putting the second amplifier into its active mode.

5. The circuit as set forth in claim 3, the switch comprising a first terminal coupled to the second load port and comprising a second terminal coupled to the capacitive impedance, the circuit further comprising: a comparator, the comparator comprising a first input port coupled to the first terminal of the switch and comprising a second input port coupled to the second terminal of the switch.

6. The circuit as set forth in claim 5, the comparator having state, the circuit to put the switch into its second state when the output voltage is outside the operating range and the comparator changes state.

7. The circuit as set forth in claim 1, the output port of the second amplifier coupled to the second load port.

8. The circuit as set forth in claim 1, the output port of the second amplifier connected to the switch, the switch to couple the output port of the second amplifier to the second load port when the switch is in its second state.

9. A circuit comprising:
a load;
a first amplifier to drive the load, the first amplifier having an output voltage Vo1(t), the first amplifier comprising an input port having an input voltage Vin(t);
a second amplifier comprising an input port having an input voltage Vin2(t);
a capacitive impedance; and
a switch to couple the capacitive impedance to the load port only when the switch is in a first state, the circuit to put the switch into its first state when the output voltage is within an operating range;
wherein the first amplifier is coupled to the second amplifier so that [.delta.Vin2(t)/.delta.Vin(t)] is substantially equal to the negative of [.delta.Vin2(t)/.delta.Vo1(t)][G1], where G1 is the gain of the first amplifier.

10. The circuit as set forth in claim 9, the capacitive impedance having a voltage drop Vcp(t), the second amplifier comprising an output port having an output voltage Vo2(t), wherein the capacitive apparatus is coupled to the second amplifier such that .delta.Vo2(t)/.delta.Vcp(t) is substantially equal to one.

11. The circuit as set forth in claim 9, the second amplifier having an active mode, the circuit to put the second amplifier into its active mode when the output voltage is outside the operating mode, and to put the second amplifier out of its active mode when the output voltage is within the operating range.

12. The circuit as set forth in claim 11, the circuit to put the switch into its second state after putting the second amplifier into its active mode.

13. The circuit as set forth in claim 11, the switch having a voltage drop, the circuit further comprising: a comparator, the comparator comprising a first input port and a second input port coupled to the switch to be responsive to the voltage drop.

14. The circuit as set forth in claim 13, the comparator having state, the circuit to put the switch into its second state when the output voltage is outside the operating range and the comparator changes state.

15. The circuit as set forth in claim 9, the output port of the second amplifier connected to the load.

16. The circuit as set forth in claim 9, the output port of the second amplifier connected to the switch, the second amplifier to drive the load only when the switch is in its second state.

17. A circuit comprising: a load; a capacitor; a first amplifier comprising an output port coupled to the load; and a switch, having a first state and a second state, to couple the load to the capacitor only if the switch is in the second state and to de-couple the load from the capacitor only if the switch is in the first state.

18. A method comprising:
driving a load with a first amplifier, the first amplifier having an input voltage Vin(t) and an output voltage Vo1(t);

activating a second amplifier to drive the load if the output voltage of the first amplifier falls outside a voltage window, the second amplifier having an input voltage Vin2(t); and decoupling a capacitive impedance from the load after the second amplifier is activated;

wherein the first amplifier is coupled to the second amplifier so that .delta.Vin2(t)/.delta.Vin(t) is substantially eaual to the negative of [.delta.Vin2(t)/.delta.Vo1 (t)][G1], where G1 is the pain of the first amplifier.

19. The method as set forth in claim 18, further comprising:

deactivating the second amplifier and coupling the capacitive impedance to the load if the output voltage of the first amplifier falls within the voltage window.

* * * * *